(12) United States Patent
Johansson

(10) Patent No.: US 12,153,266 B2
(45) Date of Patent: Nov. 26, 2024

(54) FEED-THROUGH

(71) Applicant: Hans-Erik Johansson i Hagstad AB, Gnosjö (SE)

(72) Inventor: Hans-Erik Johansson, Gnosjö (SE)

(73) Assignee: HANS-ERIK JOHANSSON I HAGSTAD AB, Gnosjö (SE)

( * ) Notice: Subject to any disclaimer, the term of this patent is extended or adjusted under 35 U.S.C. 154(b) by 213 days.

(21) Appl. No.: 17/609,840

(22) PCT Filed: May 7, 2020

(86) PCT No.: PCT/SE2020/050471
§ 371 (c)(1),
(2) Date: Nov. 9, 2021

(87) PCT Pub. No.: WO2020/226564
PCT Pub. Date: Nov. 12, 2020

(65) Prior Publication Data
US 2022/0221660 A1    Jul. 14, 2022

(30) Foreign Application Priority Data

May 9, 2019  (SE) .................................. 1950558-5
May 9, 2019  (SE) .................................. 1950559-3

(51) Int. Cl.
*G02B 6/38* (2006.01)
*G02B 6/42* (2006.01)
(Continued)

(52) U.S. Cl.
CPC ......... *G02B 6/3897* (2013.01); *G02B 6/4277* (2013.01); *G02B 6/4471* (2013.01); *H05K 5/069* (2013.01); *H05K 9/0018* (2013.01)

(58) Field of Classification Search
CPC .. G02B 6/3897; G02B 6/4277; G02B 6/4471; H05K 5/069; H05K 9/0018
See application file for complete search history.

(56) References Cited

U.S. PATENT DOCUMENTS

| 4,008,948 | A | 2/1977 | Dalgleish et al. |
| 4,849,723 | A | 7/1989 | Oliver, Jr. |

(Continued)

FOREIGN PATENT DOCUMENTS

| DE | 10 2010 031 345 A1 | 1/2011 |
| DE | 10 2016 102 671 A1 | 8/2017 |

(Continued)

OTHER PUBLICATIONS

International Search Report from International Application No. PCT/SE2020/050471 mailed Aug. 14, 2020.
(Continued)

*Primary Examiner* — Daniel Petkovsek
(74) *Attorney, Agent, or Firm* — Kagan Binder, PLLC

(57) ABSTRACT

A revolver-type feed-through for TEMPEST-grade electromagnetic shielding where one or more non-electric signal leads pass through a wall of a cabinet or other enclosure comprises a housing having a conical inner surface, the housing being attachable to the wall through a first attachment means; and a plug member having a conical outer surface matching the conical inner surface of the housing, the plug member being attachable to the housing through a second attachment means, wherein the conical inner surface of the housing and/or the conical outer surface of the plug member have recesses forming, when the plug member is attached to the housing, a plurality of waveguides. The first attachment means and the second attachment means being operable by one or more operating members located, with the feed-through in installed position, exclusively on one side of the wall, so that the first attachment means and the second attachment means are exclusively operable from the said one side of the wall.

15 Claims, 16 Drawing Sheets

(51) Int. Cl.
    *G02B 6/44*     (2006.01)
    *H05K 5/06*     (2006.01)
    *H05K 9/00*     (2006.01)

(56) References Cited

U.S. PATENT DOCUMENTS

| | | |
|---|---|---|
| 5,280,556 A | 1/1994 | Jones |
| 5,426,715 A | 6/1995 | Moisson et al. |
| 7,526,175 B2 * | 4/2009 | Sumitani ............... H02G 15/14 |
| | | 174/70 S |
| 2005/0191903 A1 | 9/2005 | Goodwin et al. |
| 2010/0001476 A1 | 1/2010 | Broder |
| 2017/0090120 A1 | 3/2017 | Oliver, III |
| 2018/0145492 A1 | 5/2018 | Naumann et al. |
| 2018/0145493 A1 | 5/2018 | Ehmann et al. |

FOREIGN PATENT DOCUMENTS

| | | | |
|---|---|---|---|
| EP | 3 128 353 A1 | 2/2017 | |
| FR | 2659749 A1 | 9/1991 | |
| JP | 2859524 B2 * | 2/1999 | ........... H02G 15/013 |
| WO | 2013/076054 A2 | 5/2013 | |
| WO | 2018/210892 A1 | 11/2018 | |

OTHER PUBLICATIONS

Office Action from counterpart Sweden Application No. 1950558-5, dated Dec. 2, 2019, 13 pp.

Office Action from counterpart Sweden Application No. 1950559-3, dated Dec. 2, 2019, 11 pp.

* cited by examiner

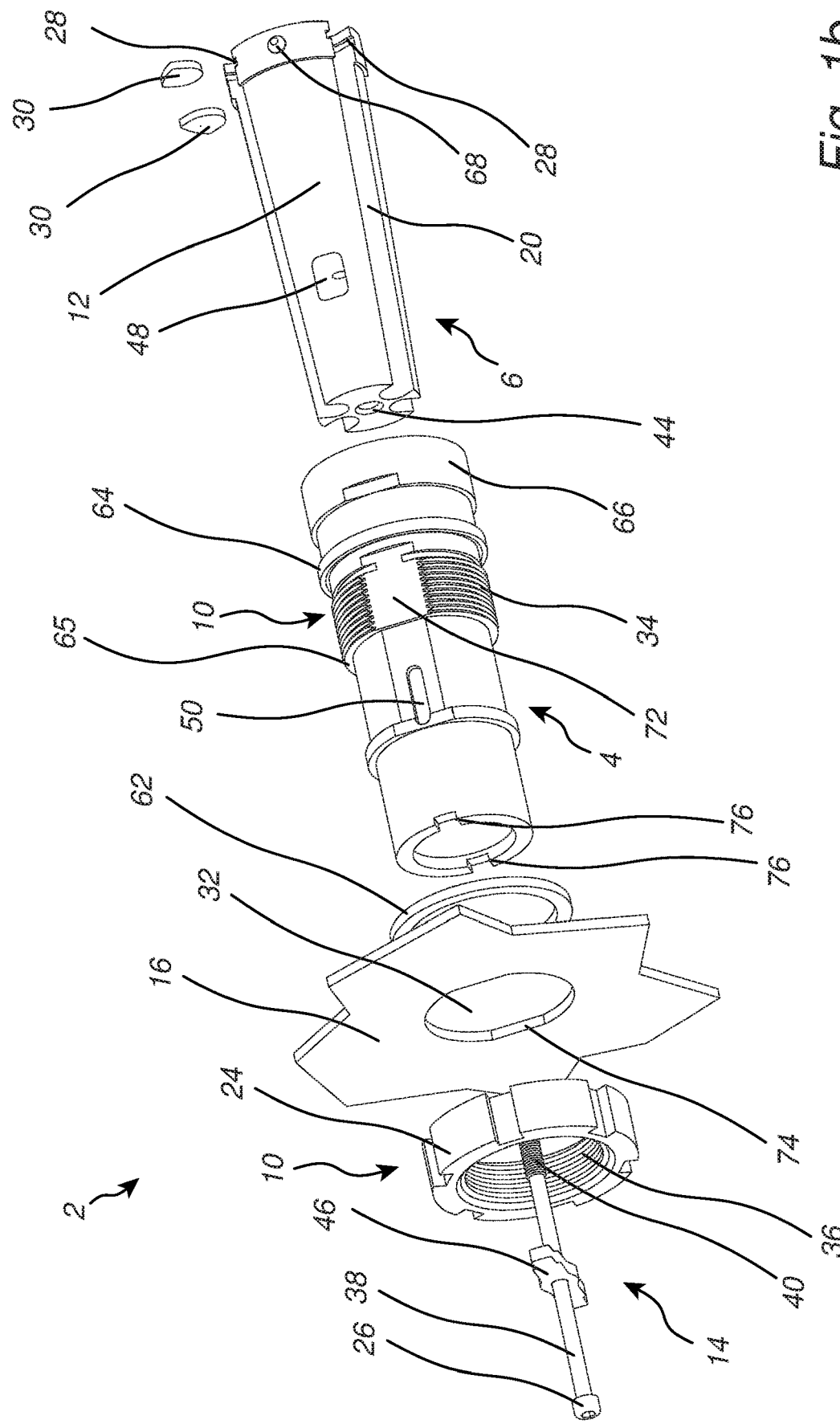

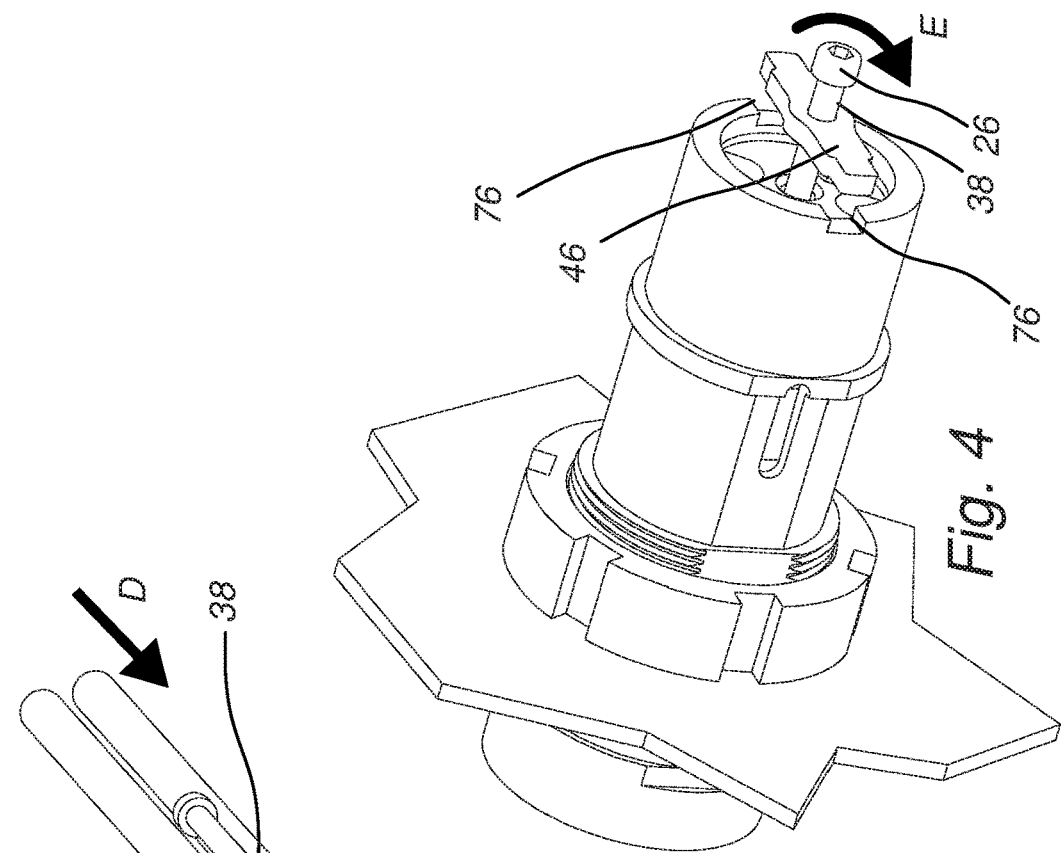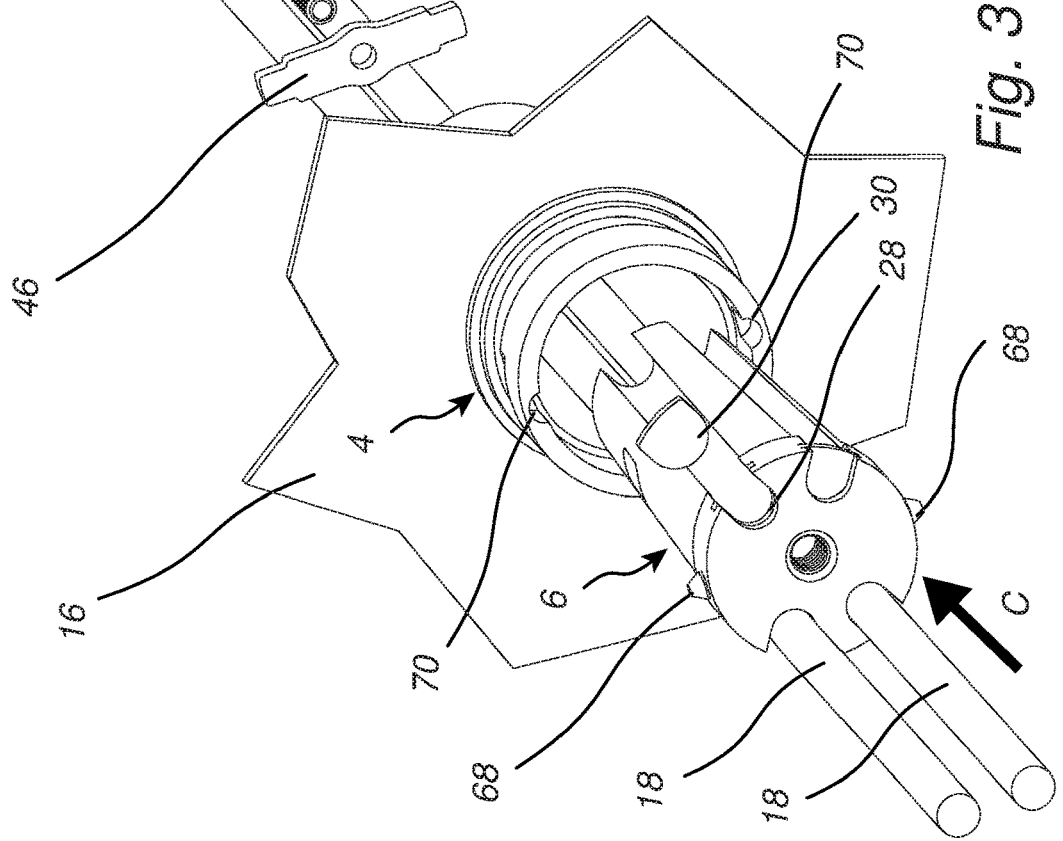

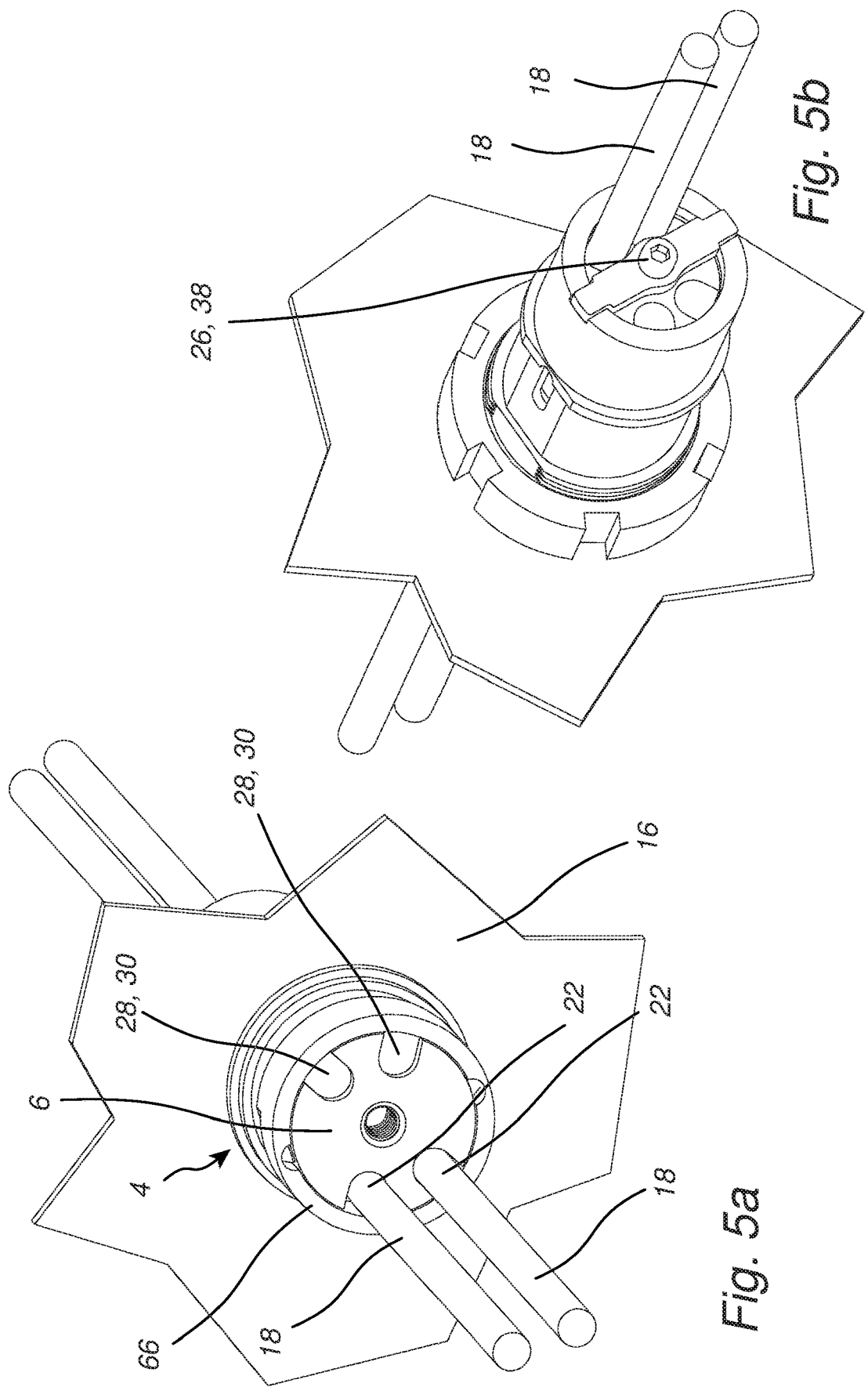

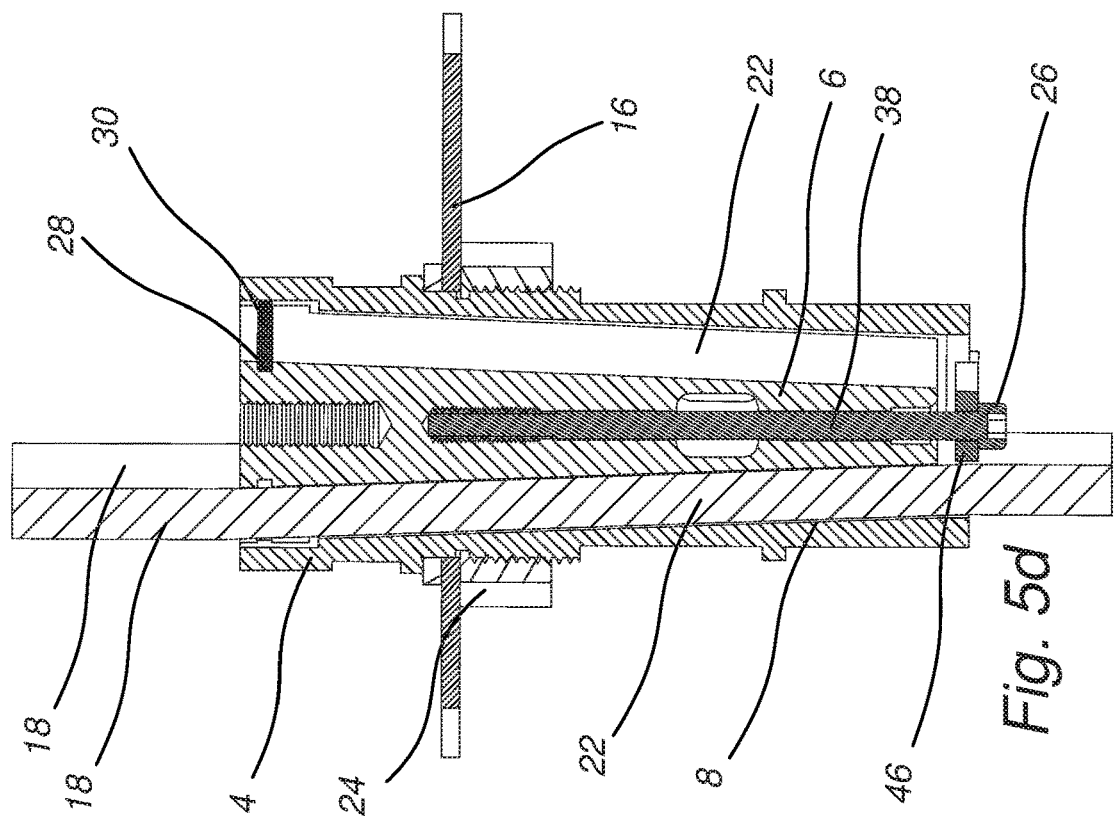
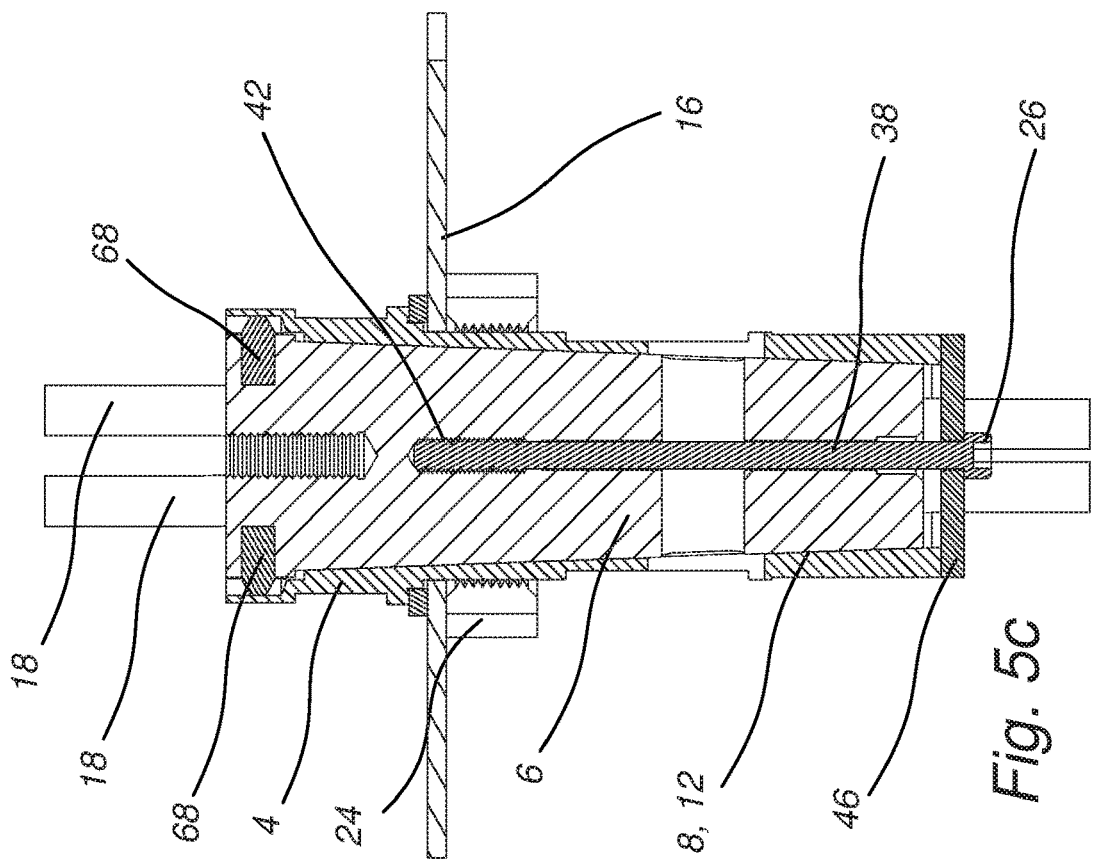
Fig. 5d
Fig. 5c

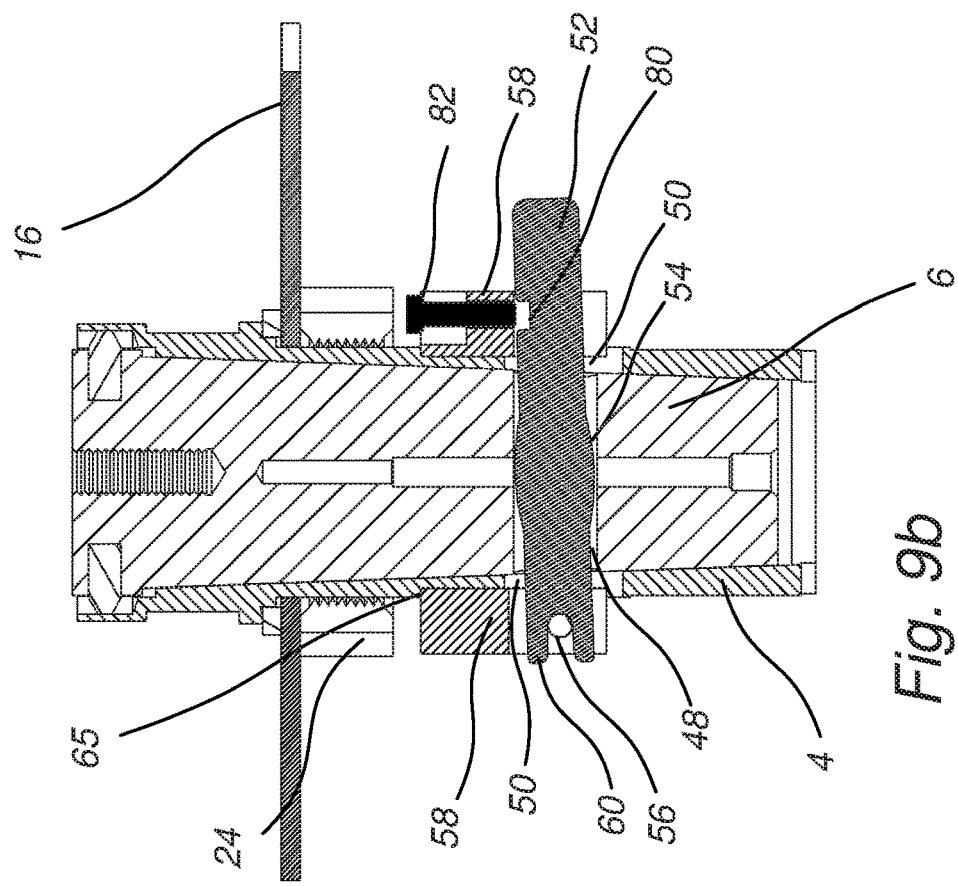
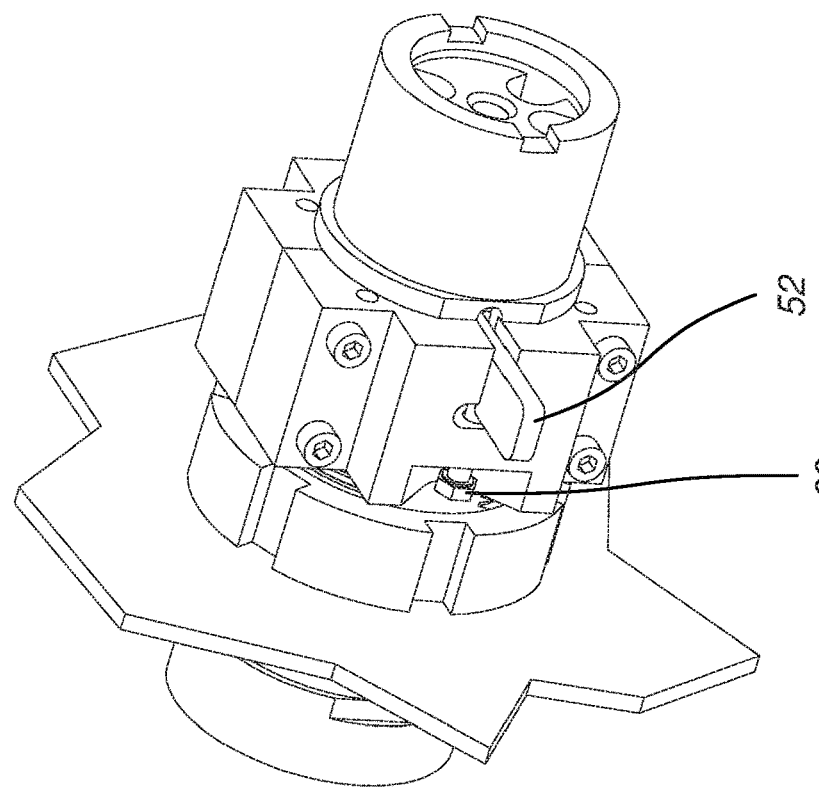
Fig. 9b
Fig. 9a

FEED-THROUGH

FIELD OF THE INVENTION

The present inventive concept relates to a revolver-type feed-through for TEMPEST-grade electromagnetic shielding where one or more non-electric signal leads pass through a wall of a cabinet or other enclosure.

BACKGROUND OF THE INVENTION

Such a feed-through can be used to prevent emission of electromagnetic waves, for example to avoid electromagnetic interference or the leakage of critical information from electronic equipment, such as a network switch or server, placed in a cabinet or enclosure. For this application, standards, usually referred to using the term "TEMPEST", are established that require attenuation up to the order of 100 dB at frequencies up to 10 GHz at the feed-through.

To achieve such attenuation characteristics, such a feed-throughs may comprise one or more waveguides operating below cut-off frequency.

Revolver-type feed-throughs, wherein a plurality of waveguides are distributed around the interface between a housing and a plug member pushable into the housing, are known in the prior art. Examples of such feedthroughs are disclosed in documents U.S. Pat. No. 4,849,723 and US20170090120A1.

There is always a need to improve such feed-throughs.

SUMMARY OF THE INVENTION

According to the present inventive concept, and, according to a first aspect, there is provided a revolver-type feed-through for TEMPEST-grade electromagnetic shielding where one or more non-electric signal leads pass through a wall of a cabinet or other enclosure, comprising a housing having a conical inner surface, the housing being attachable to the wall through a first attachment means; and a plug member having a conical outer surface matching the conical inner surface of the housing, the plug member being attachable to the housing through a second attachment means, wherein the conical inner surface of the housing and/or the conical outer surface of the plug member have recesses forming, when the plug member is attached to the housing, a plurality of waveguides. Each of the first attachment means and the second attachment means are operable by one or more operating members located, with the feed-through in installed position, exclusively on one side of the wall, so that the first attachment means and the second attachment means are exclusively operable from that one side of the wall.

Typically, the said one side of the wall is the inside of the cabinet of enclosure. In this way, a tamper- and breakin-proof feed-through is provided. Using such a feed-through eliminates or mitigates the need for additional security measures external to the feed-through, saving space and cost.

Preferably, the first attachment means and the second attachment means are removable. This allows for flexibility of installation.

A recess of the conical outer surface may have a slot for a cover, wherein, with the plug member attached to the housing and the cover installed in the slot, the housing covers the slot, preventing the cover from being removed from the slot. In typical use, a waveguide will be covered by a slot if it is unused, i.e., no signal passes through it. This provides additional security and tamper-proofing, since it eliminates the possibility of tampering with the operating members through the waveguides.

The housing may have a non-circular cross-section, which, with the housing in installed position at the wall, may fit into a corresponding non-circular opening in the wall, preventing the housing from rotating with respect to the wall. Alternatively, or additionally, the one or more operating means of the first attachment means may be operable without rotating the housing. This provides additional security and tamper-proofing, since it eliminates the possibility of tampering with or loosening the housing from the wall by rotating it.

The first attachment means may comprise an outer thread on the housing and a nut, comprising the operating member, having an inner thread matching the outer thread of the housing. This provides a simple yet secure mechanism for attaching the housing to the wall.

The second attachment means may, in a first alternative, comprise a bolt provided with an outer thread; a threaded bore in the plug member with an opening located, with the feed-through in installed position, on said one side of said wall, the threaded bore matching the outer thread of the bolt; and an elongated crossbar; wherein the bolt, with the plug member attached to said housing, pulls against said plug member through the threaded bore and pushes against the housing through the crossbar. This provides a simple yet reliable mechanism for attaching the plug member to the housing.

Using an elongated crossbar, which may fit into a pair of slots on the housing, instead of a more elaborate plate structure which must have large recesses matching the waveguides, simplifies manufacturing while still providing a second attachment means with higher strength and reliability that also is easier to install.

In a second alternative, the second attachment means may comprise a transversal slot through the plug member; a pair of openings in the housing, matching the transversal slot; and a locking rod provided with a convex surface, wherein the locking rod, with the plug member attached to the housing, extends through the transversal slot and the pair of openings and at a first end is pivoted at a pivot point fixed in position with respect to the housing and at a second end is pushed so that the convex surface abuts against an inner surface of the transversal slot, pushing the plug member in a direction into the housing.

This provides a mechanism that is easier to install, yet secure, if space behind the feed-through, usually on the inside of the cabinet or enclosure, is tight. Further, the locking rod provides a lever arm which simplifies removal of the second attachment means.

The locking rod may have a second convex surface, opposite the convex surface, where, during removal of the second attachment means, the second convex surface abuts a second inner surface of the transversal slot. This aids removal of the second attachment means using the locking rod as a lever arm.

The pivot point and the pushing may be provided by a frame arrangement mountable around the housing. The frame, in installed position, may abut against a shoulder of the housing.

Alternatively again, the feed-through may comprise second attachment means according to both the first alternative and according to the second alternative above. The alternative actually used at the point of installation may then be selected during installation of the feed-through, increasing flexibility. For example, the components may be provided as a kit.

The feed-through may further comprise a weather seal frame, comprising an upper part and a lower part adapted to fit around the housing; and a plurality of resilient sealing blocks adapted to be compressed between the upper part and the lower part of said weather seal, sealing around the one or more signal leads. Advantages and embodiments are identical to those described below in conjunction with the sixth aspect.

The plurality of waveguides may comprise four waveguides arranged in a rectangular pattern. This allows the waveguides to line up with the resilient blocks of the weather seal, allowing such a seal to be used together with the revolver-type feed-through.

The said plug member may comprise a transversally extending pin matching a transversal slot in the housing. During insertion of the plug member into the housing, the slots will rotationally guide the plug member. Further, with the plug member inserted into and attached to the housing, the slot and pin will prevent the plug member from rotating with respect to the housing. This provides a simple and robust mechanism that simplifies installation, as the plug member is ensured to always have the correct rotational configuration with respect to the housing.

According to a second aspect, there is provided a system, comprising the feed-through according to the first aspect, one or more of signal leads, and a cabinet or enclosure.

Advantages and embodiments of this second aspect are at least the same as and/or compatible with those described above in conjunction with the first aspect.

According to a third aspect, there is provided a method of installing a revolver-type feed-through for TEMPEST-grade electromagnetic shielding through a wall of a cabinet or other enclosure, comprising: attaching a housing to the wall through a first attachment means, the housing having a conical inner surface; pulling one or more non-electric signal leads through the housing; attaching a plug member to the housing through a second attachment means, an outer conical surface of said plug member matching the conical inner surface of the housing, the conical inner surface and/or the conical outer surface having recesses forming a plurality of waveguides enclosing said one or more signal leads; said method being characterized by said first attachment means and said second attachment means being exclusively operated from one side of said wall.

Advantages and embodiments of this third aspect are at least the same as and/or compatible with those described above in conjunction with the first aspect.

According to a fourth aspect, there is provided a revolver-type feed-through for TEMPEST-grade electromagnetic shielding where one or more non-electric signal leads pass through a wall of a cabinet or other enclosure, comprising a housing having a conical inner surface, the housing being attachable to the wall through a first attachment means; and a plug member having a conical outer surface matching the conical inner surface of the housing, the plug member being attachable to the housing through a second attachment means, wherein the conical inner surface of the housing and/or the conical outer surface of the plug member have recesses forming, when the plug member is attached to said housing, a plurality of waveguides, the feed-through being characterized by further comprising a weather seal frame comprising an upper part and a lower part adapted to fit around and seal against the housing; and a plurality of resilient sealing blocks adapted to be compressed between the upper part and the lower part of said weather seal, sealing around the one or more signal leads.

With weather seal should be understood a seal sealing against one or more of, but not limited to, weather, moist, dirt, oil, splashing water, which may be fresh or salt water, or similar.

This allows weather sealing to be provided directly by the feed-through, eliminating the need for additional measures to provide weather sealing, for example the need to place the cabinet or enclosure in a weather-sealed room. This saves space. This, for example, is useful in marine applications.

The upper part and the lower part may be identical in design, which simplifies manufacturing and installation.

Advantages and embodiments described above in conjunction with the first aspect are compatible with this fourth aspect.

According to a fifth aspect, there is provided use of a revolver-type feed-through for TEMPEST-grade electromagnetic shielding where one or more non-electric signal leads pass through a wall of a cabinet or other enclosure, the feed-through comprising: a housing having a conical inner surface, the housing being attachable to the wall through a first attachment means; and a plug member having a conical outer surface matching the conical inner surface of the housing, the plug member being attachable to the housing through a second attachment means, wherein the conical inner surface of the housing and/or the conical outer surface of the plug member have recesses forming, when the plug member is attached to the housing, a plurality of waveguides, in combination with a weather seal comprising a weather seal frame comprising an upper part and a lower part adapted to fit around and seal against the housing; and a plurality of resilient sealing blocks adapted to be compressed between the upper part and the lower part of the weather seal frame, sealing around the one or more signal leads.

Advantages and embodiments of this fifth aspect are at least the same as and/or compatible with those described above fourth aspect. Advantages and embodiments described above in conjunction with the first aspect are compatible with this fifth aspect.

BRIEF DESCRIPTION OF THE DRAWINGS

The above, as well as additional objects, features and advantages of the present inventive concept, will be better understood through the following illustrative and non-limiting detailed description of preferred embodiments, with reference to the appended drawings, where the same reference numerals will be used for similar elements, wherein:

FIGS. 1a and 1b are exploded views, from two different respective angles, of a revolver-type feedthrough;

FIGS. 9b and 10 are cross-sectional views;

DETAILED DESCRIPTION OF THE PREFERRED EMBODIMENT

Figure 17:
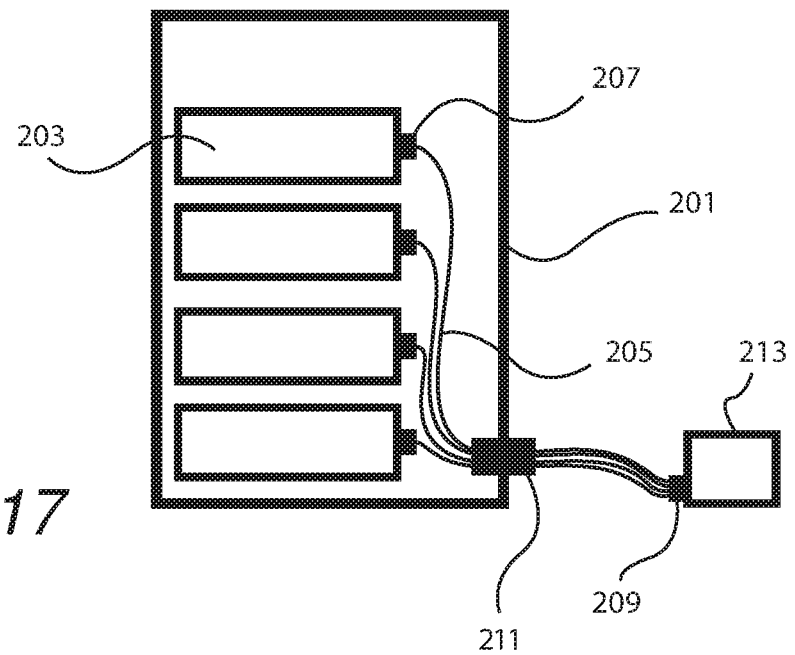
FIG. 17 schematically illustrates a protected cabinet or other enclosure.

FIG. 17 illustrates a protected cabinet or other enclosure 201, which is a context where a feed-through 2 (cf. FIGS. 1a and 1b) according to the present disclosure can be used. Such a cabinet or other enclosure can be used in a sensitive environment where processing devices 203 in the cabinet 201, such as servers, electronically process unencrypted or encrypted sensitive information. The cabinet 201, made from an electrically conductive material, which may be thick sheet metal, functions as a Faraday cage, containing within its enclosure any electromagnetic radiation from the processing devices 203, thereby preventing the leakage of sensitive information. The processing devices 203 communicate with nodes 213 outside the cabinet 201 via non-electric signal leads 205, such as optical fibers, which are terminated by means of connectors 207, 209 at each if their ends. The signal-leads must be non-electric in order not to spoil the functioning of the shielding, as an electric signal lead would act as an antenna, spoiling the shielding of the inside of the cabinet or enclosure. The signal leads may convey less sensitive information or the information carried by them may be encrypted. Furthermore, the conveyed optical signals as such usually give negligible leaked radiation, preventing interception of such signals, unless the fibers are tampered with.

The feed-through where the optical fibers extend out of the cabinet 201 requires special attention so that electromagnetic radiation does not escape the cabinet, risking interception by a third party nearby.

In addition to the shielding situation described above, the feed-through may be useful in other situations where considerable attenuation at a connection into a Faraday cage is needed. For instance, as the effect provided is more or less reciprocal, the feed-through could protect sensitive equipment in a cabinet from external electromagnetic interference, such as electromagnetic pulses with high energy. Further, a shielded room used for sensitive measurements could be protected from external electromagnetic interference, etc.

Additionally, the cabinet or enclosure 201 may be subject to requirements of weather proofing and/or tamper proofing and/or security against break-in. Normally such feed-throughs do not provide such functionality by themselves, requiring such functionality to be provided external to the cabinet or enclosure 201, for example by the cabinet or enclosure being located in a secured and/or weather sealed room. With the present inventive concept, such functionality may be provided directly by the feed-through itself. This is particularly advantageous in environments where space is at a premium.

Figure 16:
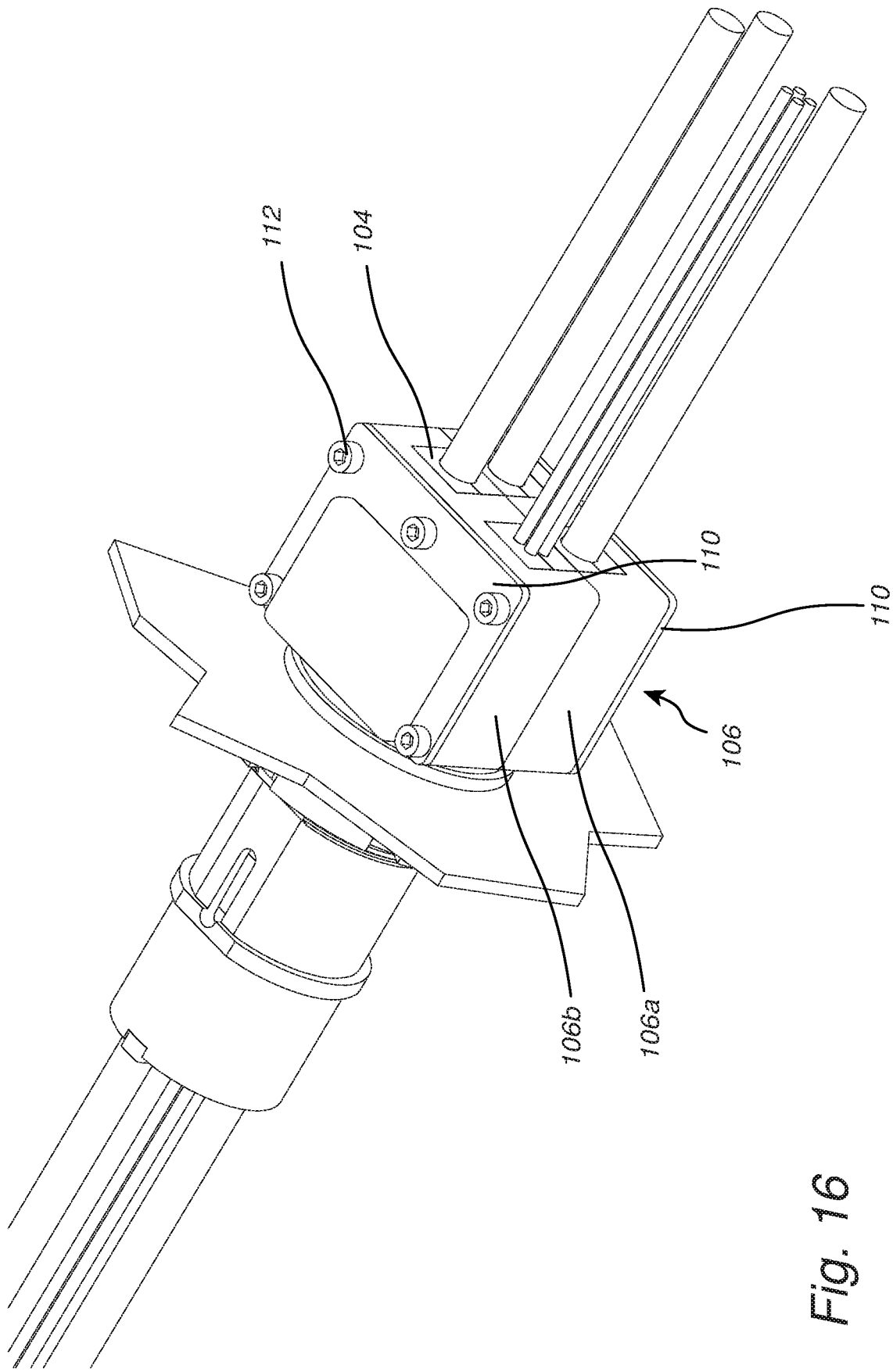

As is well known per se, an attenuating feed-through can be obtained by means of a waveguide below-cutoff, WBCO, of which one example is schematically illustrated in FIG. 16. In this example the waveguide 212, made from a conductive material, has a cavity 214, open at both ends, with a circular cross section with diameter D and a length 1. The waveguide extends through a wall in a Faraday cage 201.

Electromagnetic waves can propagate through a waveguide in a number of different modes, corresponding to different solutions to the Maxwell equations. These modes are distinguished by different configurations of the electric and magnetic fields. Each of these modes has a cut-off frequency, below which no substantial propagation in that mode is possible. Below the lowest cut-off frequency of all possible modes, no substantial propagation of electromagnetic waves is possible at all. Instead, signals suffer exponential attenuation. For example, in a circular waveguide, the mode with the lowest cut-off frequency is the $TE_{11}$ (transverse electric) mode. The cut-off frequency $f_c$ of that mode can be shown to be, to three significant figures, $$f_c = \frac{0.586v}{D},$$

where v is the propagation speed of the waveguide dielectric, i.e., the non-conductive material forming the bulk of the waveguide cavity. In air, v is to a good approximation $3 \times 10^8$ m/s. Below this cut-off frequency, over a distance l, an electromagnetic wave with frequency f suffers a total attenuation of again to three significant figures, $$A = 32.0 \frac{l}{D} \sqrt{1 - \left(\frac{f}{f_c}\right)^2} \text{ dB}.$$

It can thus be seen that to maximize attenuation of signals of a certain frequency requires as high a cut-off frequency as possible, and thus as narrow a waveguide as possible, as well as a long a waveguide as possible. It can also be seen that the larger the diameter a waveguide has, the longer the waveguide needs to be to achieve target attenuation.

Figure 1A:
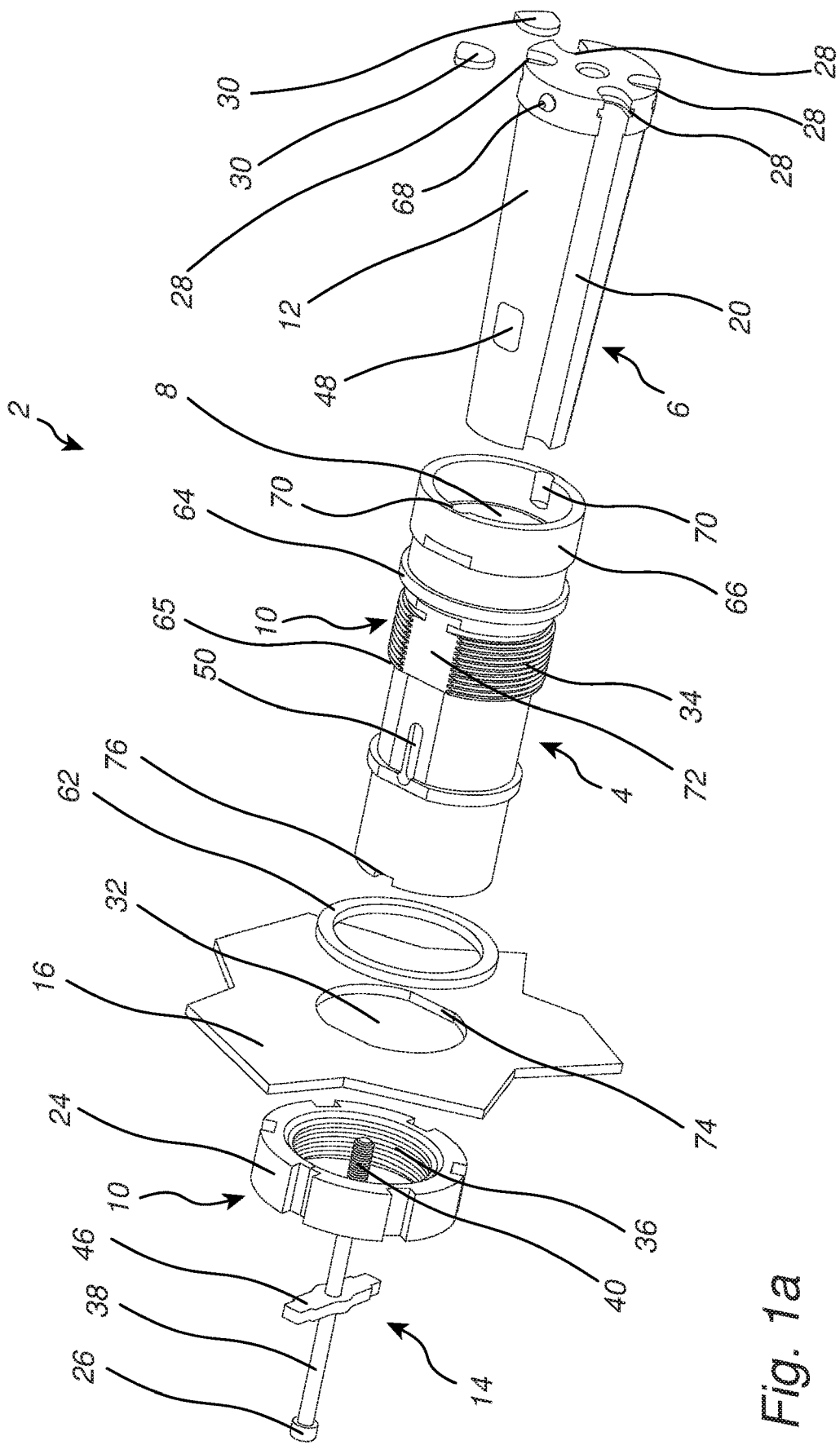
Figure 18:
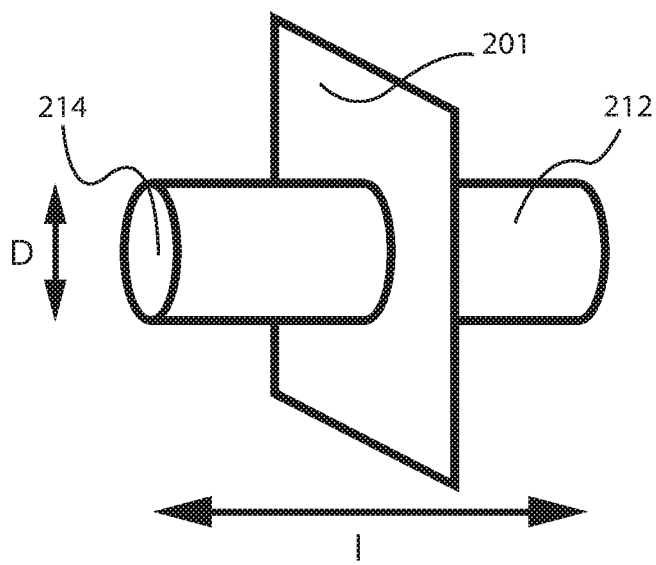
FIG. 18 schematically illustrates a waveguide operating below-cutoff frequency.

FIGS. 1a and 1b show exploded views, from two different angles, of a revolver-type feed-through 2 providing TEMPEST-grade electromagnetic shielding where one or more non-electric signal leads 18 (cf. FIG. 15) pass through a wall 16 of a cabinet or enclosure (cf. 101, FIG. 15), for example in the context described above with reference to FIGS. 17 and 18.

The feed-through 2 is intended to be attached to the wall 16 and comprises a housing 4 intended to be attached to the wall 16 and a plug member 6 intended to be attached to the housing 4. The wall 16 has a first side, typically corresponding to the outside of the cabinet or enclosure, towards the housing 4 and plug member 6, as depicted in FIGS. 1a and 1b, and a second side, typically corresponding to the inside of the cabinet or enclosure, towards the nut 24 and the bolt 38, again as depicted in FIGS. 1a and 1b.

The housing 4 has a conical inner surface 8 matching a conical outer surface 12 of the plug member 6 so that a tight fit may be achieved between the conical inner surface 8 and the conical outer surface 12 (cf. FIG. 5c).

The plug member has a plurality of longitudinal recesses 20, so that, with the plug member 6 inserted into and attached to the housing 4, the conical outer surface 12 of the plug member 6 meets the conical inner surface 8 of the housing 4, each recess 20 forming a waveguide 22 (cf. FIG. 5d) through the feed-though 2.

In the depicted feed-through 2, only the plug member 6 has recesses 20. However, it is equally possible for the wave-guide-forming recesses 20 to instead be located on the conical inner surface 8 of the housing 4, or on both the conical inner surface 8 of the housing 4 and the conical outer surface 12 of the plug member 6.

In order to properly form the respective waveguides 22, a tight fit is needed between the housing 4 and the plug member 6. The housing 4 and the plug member 6 must thus be formed from material with good electrical conductivity, typically a metal such as steel or brass. Typically, they are made from machined, such as lathed, parts in order to achieve the required tolerances needed for a tight fit between the two parts.

The depicted plug member has four recesses 20 evenly distributed around the outer surface 12 so to form a quadratic, i.e., rectangular pattern. Thus, the waveguides 22 formed when the plug member 6 is inserted into the housing 4 will also form a quadratic/rectangular pattern.

Each of the recesses 20 of the outer conical surface 12 of the plug member 6 has a slot 28 located close to the outer end of the plug member 6, in installed position on the first side of the wall. Before the plug member 6 is inserted into the housing 4, a cover 30 may optionally be inserted into a respective such slot 28. With the plug member 6 then inserted into the housing 4, the wall 66 close to the outer end of the housing 4 will cover the cover 30 so that the cover 30 cannot be removed from the slot, preventing an intruder from gaining access to the opposite, second, side of the wall through the waveguide 22 located behind the cover 30.

The plug member 6 comprises two transversally extending and diametrically opposite pins 68 located close to the outer end of the plug member 6, matching two respective slots 70 in the housing 4. During insertion of the plug member 6 into the housing 4, the plug member 6 will be guided rotationally by the slots 70. Further, with the plug member 6 inserted into and attached to the housing 4, the slots 70 and pins 68 will prevent the plug member 6 from rotating with respect to the housing 4.

The feed-through 2 further comprises a first attachment means 10 for attaching the housing 4 to the wall 16 of the cabinet or enclosure. The second attachment means is in the form of an outer thread 34 on the housing 4 and a nut 24 with an inner thread 36 matching the outer thread 34 of the housing 4. Further, a washer 62 protects the housing 4 and will, in installed position, be located between the wall 16 and a shoulder 64 on the housing 4, located next to the outer thread 34. The washer 62 ensures electrical contact between the housing 4 and the electrically-conducting wall 16 and is preferably made of a material softer than the housing and/or the wall, such as copper. The nut 24 acts as an operating member for the first attachment means 10 and is, with the housing 4 in installed position, entirely located on the second side of the wall 16. Thus the first attachment means 10 is only operable from that second side of the wall 16. The nut 24 can be rotated without rotating the housing 4 with respect to the wall 16. Thus, the operating means 24 of the first attachment means 10 is operable without rotating the housing 4.

The part of the housing 4 which in installed position extends through the wall 16 has a non-circular cross-section, as evident by two diametrically opposed flat sections 72. This is matched by a corresponding non-circular cross section of the hole 32 in the wall 16, including two straight sections 74 matching the flat sections 72 of the housing 72. This geometric configuration prevents the housing, in installed position attached to the wall, from rotating with respect to the wall 16.

The feed-through 2 of FIGS. 1a and 1b further comprises a second attachment means 26 for attaching the plug member 6 to the housing 4, comprising the following. A bolt 38 is provided with an outer thread 40. The bolt may be inserted into an elongated crossbar 46. The thread 40 matches an inner thread of a threaded bore 42 (cf. FIG. 5c) in the plug member. The threaded bore 42 has an opening located, with the plug member 6 inserted into and attached to the housing 4, on the inner side of the wall 16.

A head 26 of the bolt 38 may be rotated by a user to drive the bolt 38 into the plug member 6, thereby pulling the plug member 6 into the housing 4. Thus, the head 26 acts as an operating member for the second attachment means and is entirely located, in installed position, on the same, second, side of the wall 16 as the operating member of the first attachment means. Thus the second attachment means 14 is only operable from that second side of the wall 16.

In installed position, the bolt 38 pulls against the plug member 6, keeping it attached to the housing 4 through the thread of the threaded bore 42 of the plug member 6 (cf. FIG. 5c), while pushing against the housing though the crossbar 46, which abuts two slots 76 located at the inner end of the housing 4.

Figure 2B:
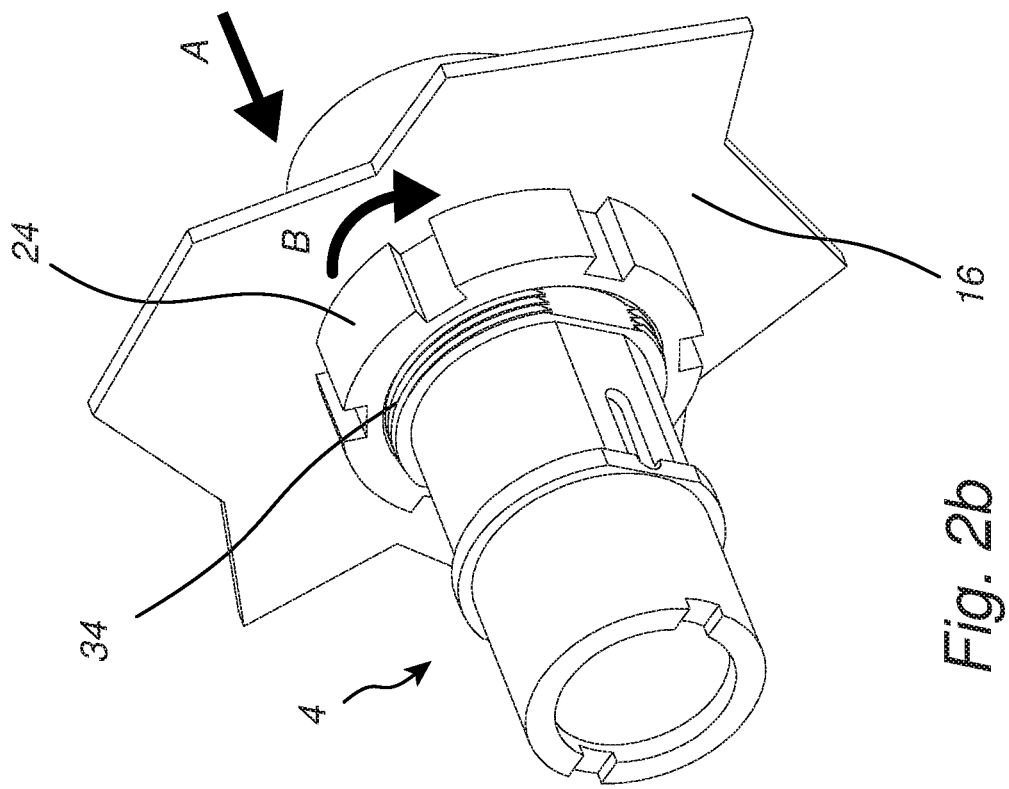
FIGS. 2a, 2b; 3; 4, and 5a, 5b, 5c, 5d show a typical assembly sequence of the feed-through, wherein FIGS. 2a, 2b; 3; 4; and 5a, 5b are perspective views and 5c, 5d are cross-sectional views.
Figure 2A:
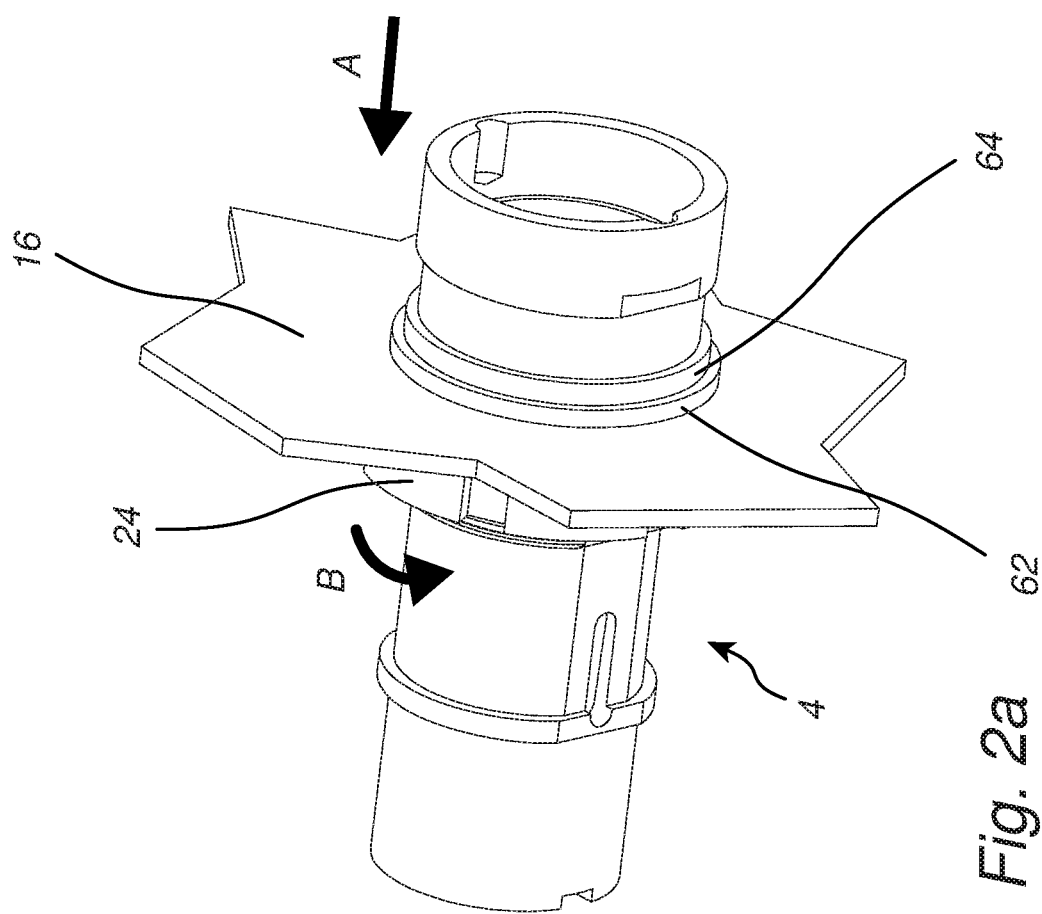

FIGS. 2a, 2b; 3; 4 and 5a-d show a typical assembly sequence of the feed-through 2.

First, with reference to FIGS. 2a and 2b, the housing 4 is pushed from the first side of the wall 16 into the hole 32 of the wall 16 (cf. FIGS. 1a and 1b), as indicated by an arrow A, the non-circular cross-section of the housing 4 lining up with the non-circular cross section of the hole 32 of the wall 16, with the washer 62 located on the first side of the wall 16 between the wall 16 and the shoulder 64 of the housing 4.

Then, the first attachment means 10 (cf. FIGS. 1a and 1b) is operated, on the second side of the wall 16, by operating the operating means, by tightening the nut 24 by rotating it, as indicated by an arrow B. With the nut 24 tightened, the housing 4 is now attached to the wall 16 through the first attachment means 10.

Then, with reference to FIG. 3, one or more non-electric signal leads 18—typically optical fibers or fiber-optic cables—are pulled through the housing 4 and thus through the wall 16. Covers 30 may be placed into the slots 28 corresponding to recesses 20/waveguides 22 (cf. FIGS. 1a and 1b) not intended to carry signal leads 18.

Then, still with reference to FIG. 3, the plug member 6 is pushed into the housing 4, from the first side of the wall 16, as indicated by an arrow C, the pins 68 being guided by the slots 70. The waveguides 22 (cf. FIGS. 5a, 5b) are formed.

Then, still with reference to FIG. 3, the bolt 38 is pushed, from the second side of the wall 16, through the hole of the crossbar 46 and into the opening 44 (cf. FIG. 1b) of the plug member and the crossbar 46 placed into the two slots 76 (cf. FIGS. 1b, 4) of the housing 4, as indicated by an arrow D.

Then, with reference to FIG. 4, the bolt 38 is tightened, on the second side of the wall 16, by engaging the head 26 with a suitable tool and rotating the head 26, as indicated by an arrow E.

With reference to FIGS. 5a, 5b, 5c, and 5d, with the bolt 38 tightened, the plug member 6 is now attached to the housing 4 through the second attachment means 14 (cf. FIGS. 1a, 1b). The signal leads 18 run through waveguides 22 formed between the housing 4 and the plug member 6, while waveguides having no signal leads are covered and blocked by the covers 30 placed into the slots 28, with the covers 30 being prevented from being removed from their respective slots 28 in the plug member 6 by the wall 66 of the housing 4.

As is best seen in FIG. 5c, the threads of the threaded bore 42 are exclusively located close to the inner end of the threaded bore 42. This ensures that the plug member 6, when attached to the housing 4, is mainly subjected to a compressing force, which makes the arrangement less sensitive to tensions caused by, e.g., temperature variations.

As is best seen in FIG. 5d, the waveguides 22 follow the cone shape of the plug member 6, diverging transversally outwards from the second side of the wall to the first side of the wall.

Figure 6:
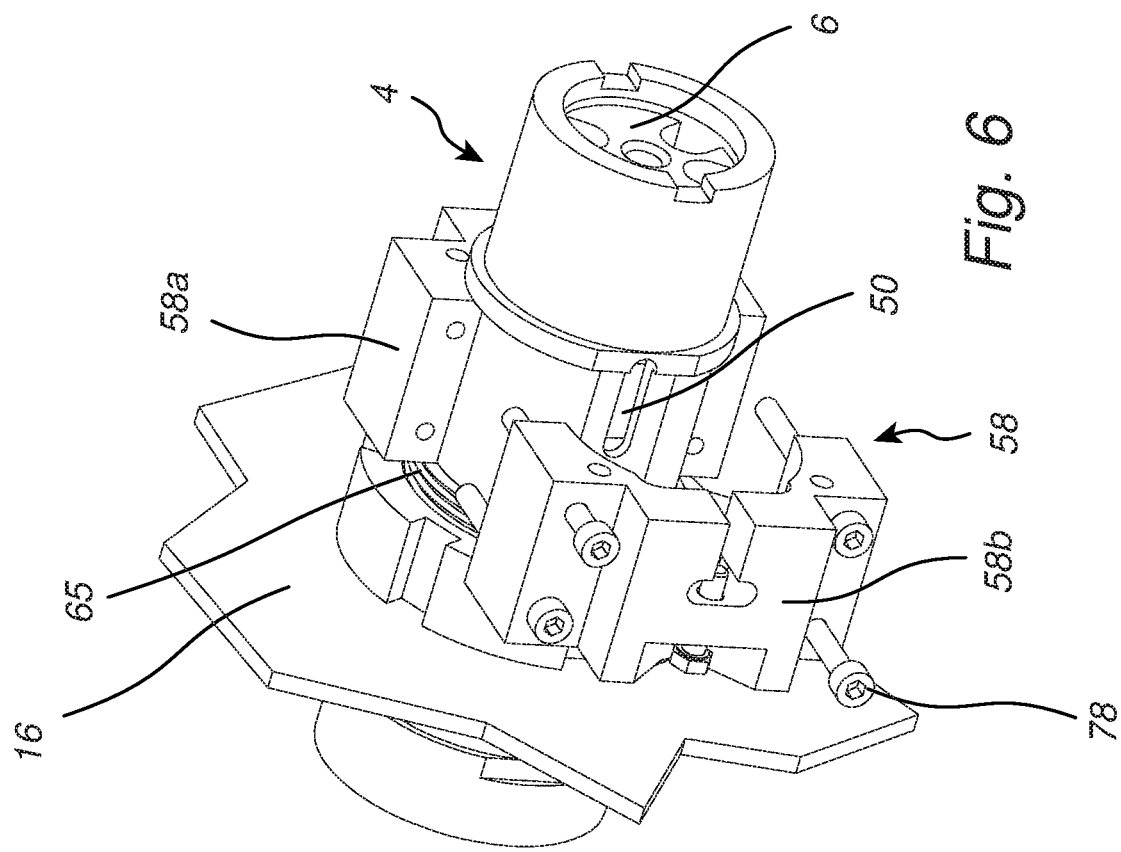
FIGS. 6; 7; 8; 9a, 9b; and 10 show a typical assembly sequence of an alternative second attachment means of the feed-through, wherein FIGS. 6; 7; 8; 9a are perspective views

FIGS. 6; 7; 8; 9a, 9b; and 10 show assembly of an alternative second attachment means 14, based on the plug member 6 having a transversal slot 48 (cf. FIGS. 1a, 1b) extending through the same and the housing having two openings 50 (cf. FIGS. 1a, 1b) matching, i.e., lining up with the transversal slot 48 of the plug member 6 when the plug member 6 has been inserted into the housing 4. In installed position, a locking rod 52 extends through the transversal slot 48 and the openings 50, pushing the plug member 6 in a direction into the housing 4, as will be explained below.

With reference to FIG. 6, starting with the plug member 6 pushed into the housing 4 (cf. the procedure above disclosed in conjunction with FIGS. 2a, 2b, and 3), a frame arrangement 58 is mounted around the housing 4 on the second side of the wall 16. The frame arrangement comprises a first part 58a and a second part 58b joined by bolts 78. Both parts 58a, 58b of the frame arrangement 58 abut a shoulder 65 of the housing 4.

Figure 7:
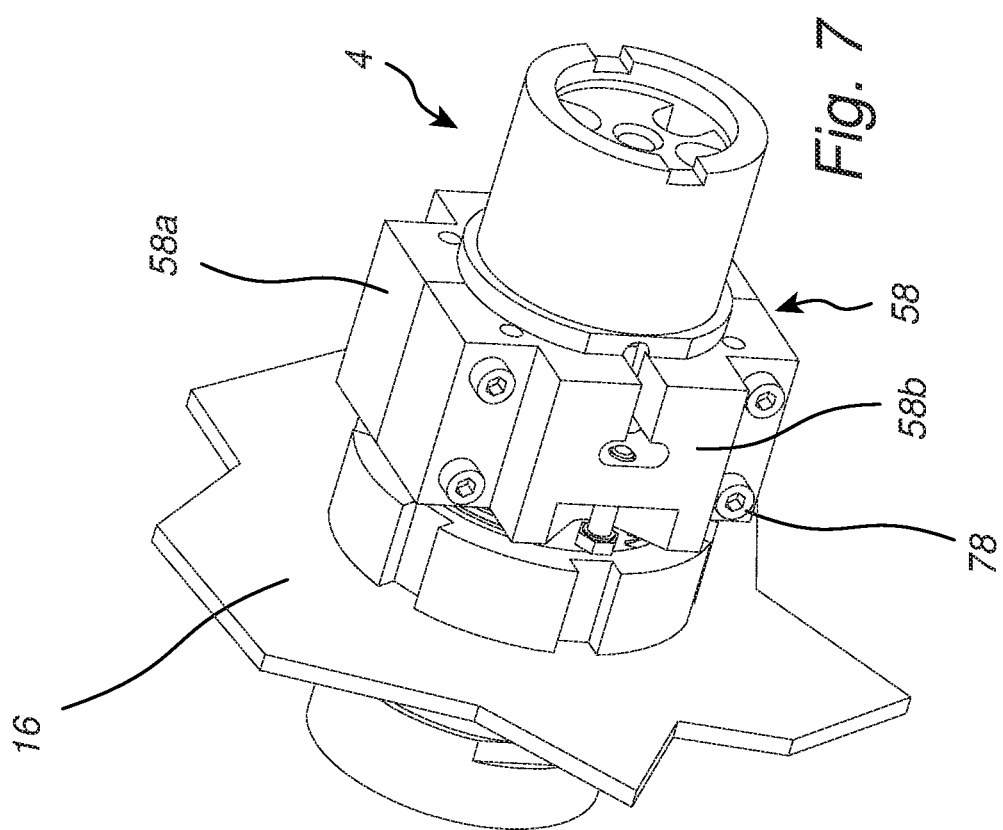

FIG. 7 shows the two parts 58a, 58b of the frame arrangement 58 thus joined by the bolts 78.

Figure 8:
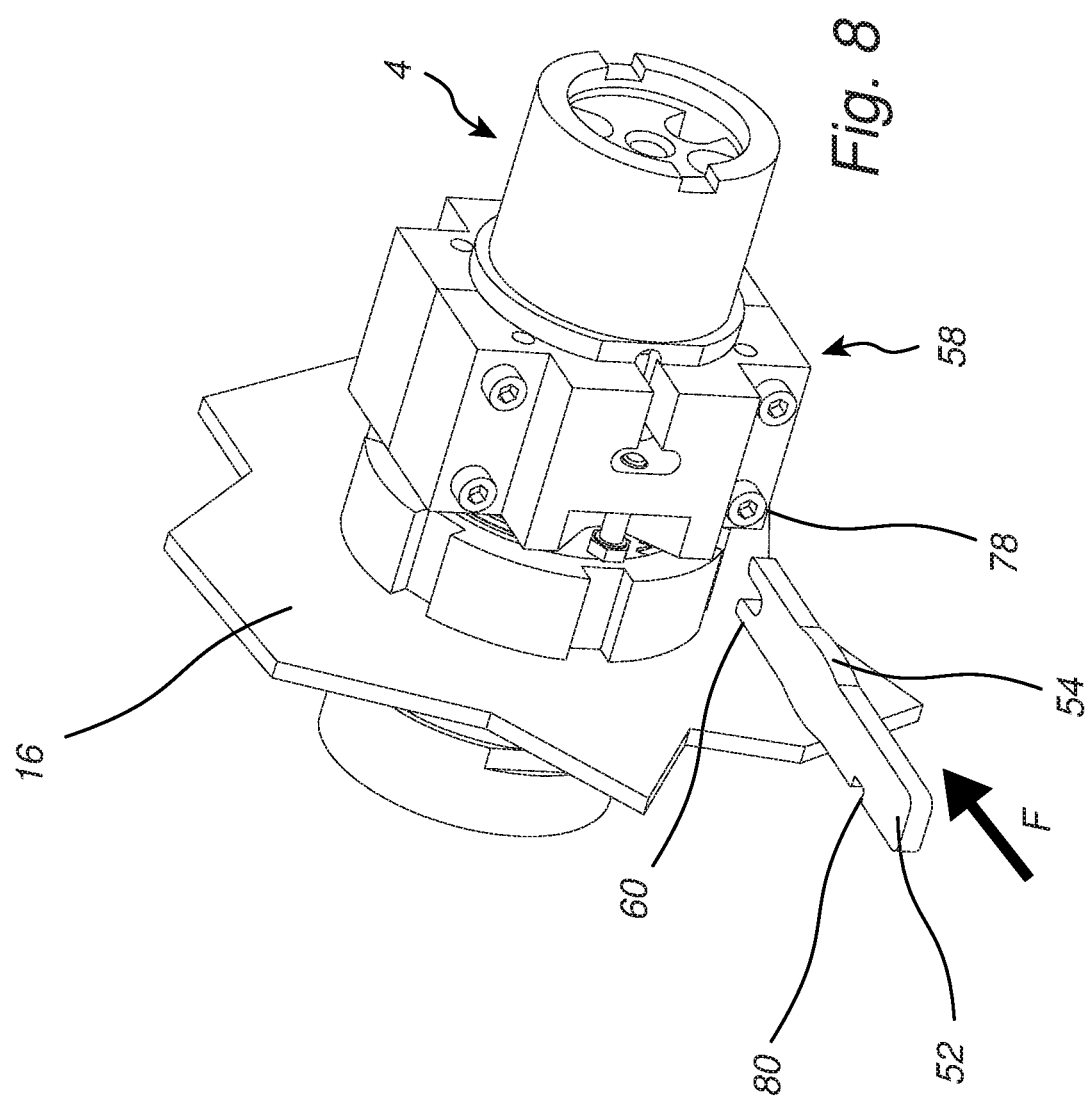

Then, with reference to FIG. 8, the locking rod 52 is inserted, as indicated by an arrow F, into the openings 50 and the transversal slot 48 (cf. FIG. 9b). The locking rod 52 has an elongate shape and is substantially flat in a vertical direction. At a first end of the locking rod 52, a two-prong fork-like structure 60 is located, extending longitudinally and horizontally from the locking rod 52. Further, a convex surface 54 extends transversally and horizontally close to the middle of the locking rod 52 along one of its long edges. A slot 80 is located close to the other, second, end of the locking rod 52 opposite that of the fork-like structure and on the opposite long edge to that of the convex surface 54, the function all of which will be explained in the following. Alternatively, the slot 80 may be replaced by a shoulder (not depicted) extending all the way to the second end of the locking rod.

FIGS. 9a and 9b show the locking rod 52 thus inserted, extending through the transversal slot 48 and the pair of openings 50. The fork-like structure 60 surrounds a pin 56 provided by the frame arrangement 58 and functioning as a pivot point for the locking rod 52. The slot 80 is aligned with a bolt 82 provided by the frame arrangement 58

The bolt 82 is then tightened, the locking rod 52 pivoting around the pin 56, which remains fixed in position with respect to the housing 4 due to the frame arrangement 58 being supported by the housing 4 through the shoulder 65. Simultaneously, the convex surface 54 of the locking rod 52 pushes the inner surface of the transversal slot 48, pushing the plug member 6 into the housing 4 and fixing it in place.

Figure 10:
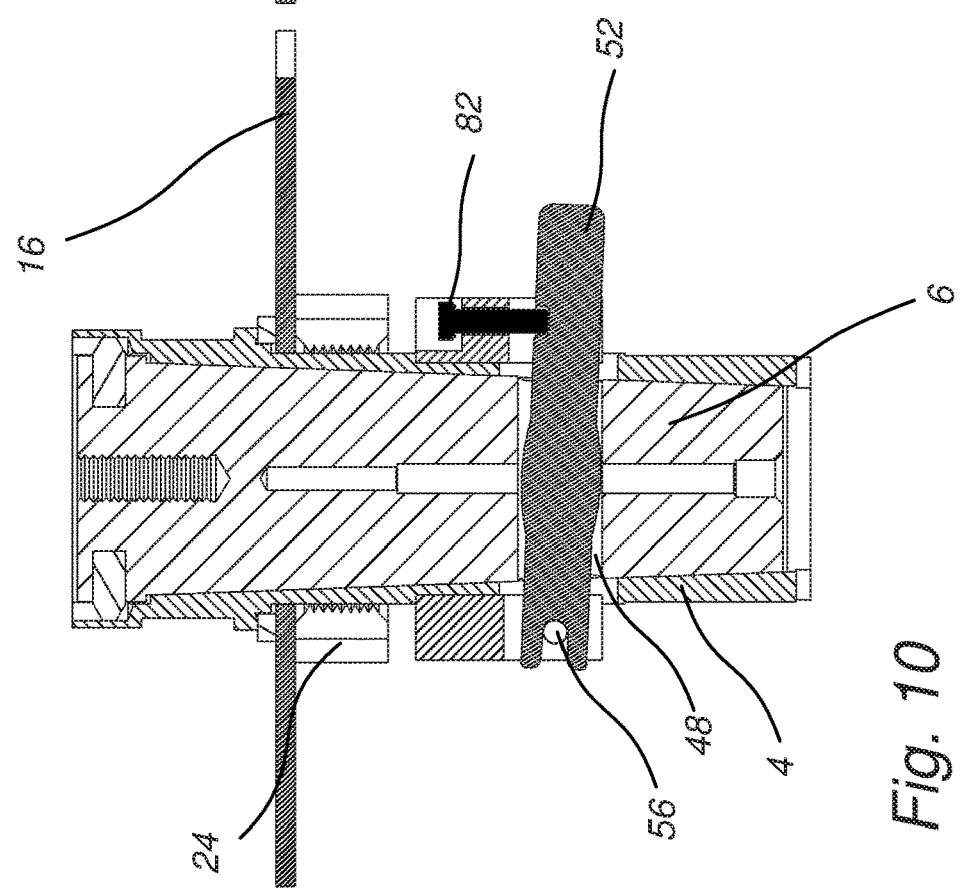

Thus, with reference to FIG. 10, the second attachment means according to the present alternative attaches the plug member 6 to the housing 4. The operating members, the locking rod 52 and the bolt 82, are exclusively operable from the second side of the wall 16, i.e., the same side as the operating member of the first attachment means, i.e., the nut 24 (cf. FIG. 2a, 2b, 3).

Figure 11:
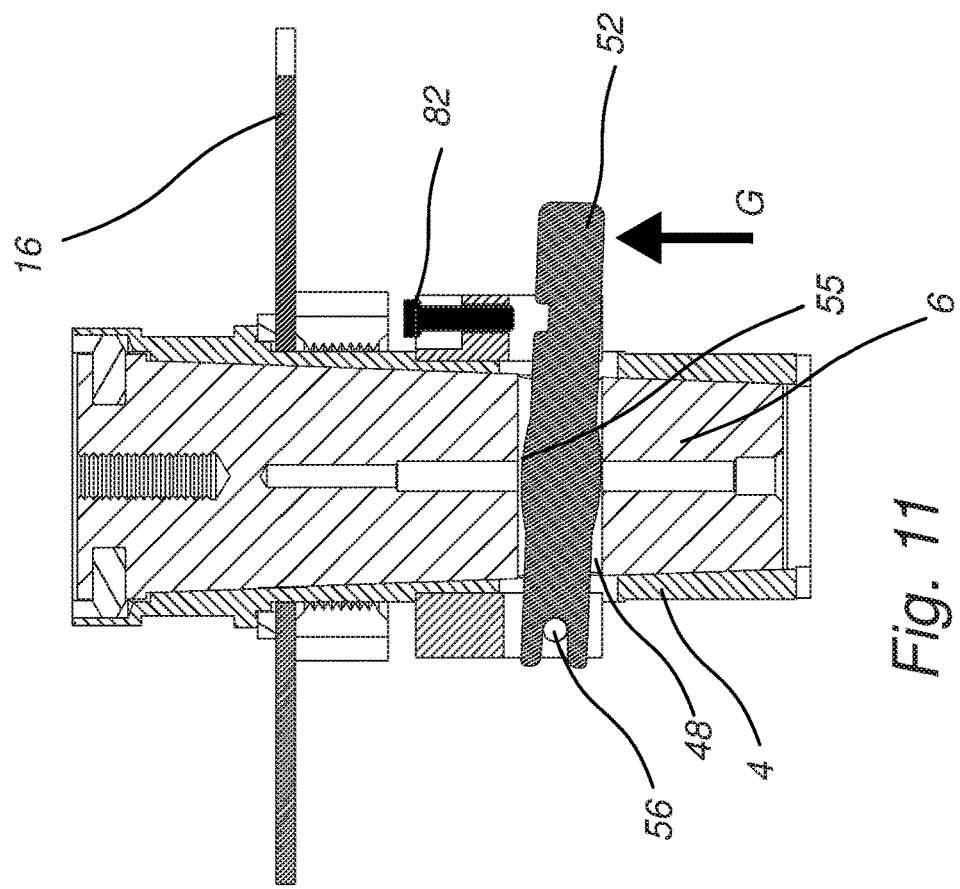
FIG. 11 is a cross-sectional view showing removal of the alternative second attachment means.

FIG. 11 illustrates removal of the alternative second attachment means 14 (cf. FIGS. 6; 7; 8; 9a, 9b; and 10). Due to the tight fit between the plug member 6 and the housing 4, some force will be required to separate the two.

First, the bolt 82 is untightened, releasing the locking rod 52.

Then, a force, such as a "knock", is applied at the free end of the locking rod 52, for example using a hammer, as illustrated by a vertical arrow G. The locking rod 52, pivoting around the pin 58, acts as a lever arm, with a second convex surface 55, opposite to the first convex surface 54 (cf. FIG. 9b) abutting a second inner surface of the transversal slot 48, pushing the plug member 6 out of the housing 4.

Finally, the locking rod 52 may be removed from the transversal slot 48 and the frame 58 may be removed from the housing 4.

The feed-through may be delivered as a kit comprising both the bolt 38 and the crossbar 46 (cf. FIG. 1a) and the frame arrangement 58 and the locking rod 52, so that the choice of the first or the second alternative for the second attachment means may be made according to need at the point of installation.

FIGS. 12, 13, 14, 15, 16 show assembly of an optional weather seal for use with a revolver-type feedthrough.

Figure 12:
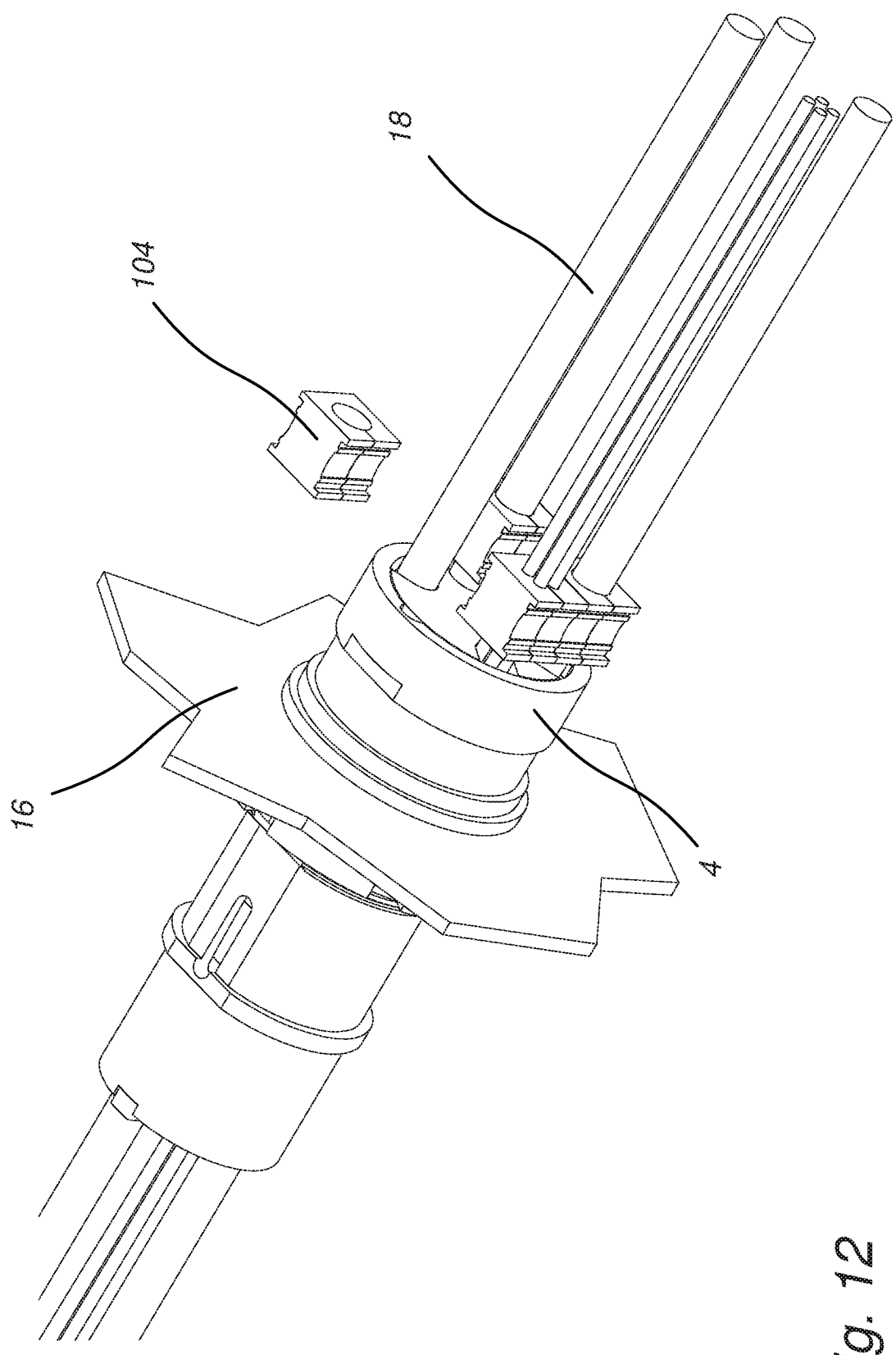
FIGS. 12, 13, 14, 15, and 16 are perspective views showing assembly of an optional weather seal for use with the feedthrough.

Starting with an assembled feed-through as described above in conjunction with FIGS. 5a-d or FIG. 11, with reference to FIG. 12, resilient substantially cube-shaped blocks 104 are attached to the signal leads outside of the housing 4 on the first side of the wall 16. As depicted, the cube-shaped blocks 104 may have one or several holes of different sizes to match the outer dimensions of the signal leads. If no signal lead is present, the corresponding block 104 may have no hole at all (not shown). The blocks 104 are made from a resilient material, such as natural or synthetic rubber.

Figure 13:
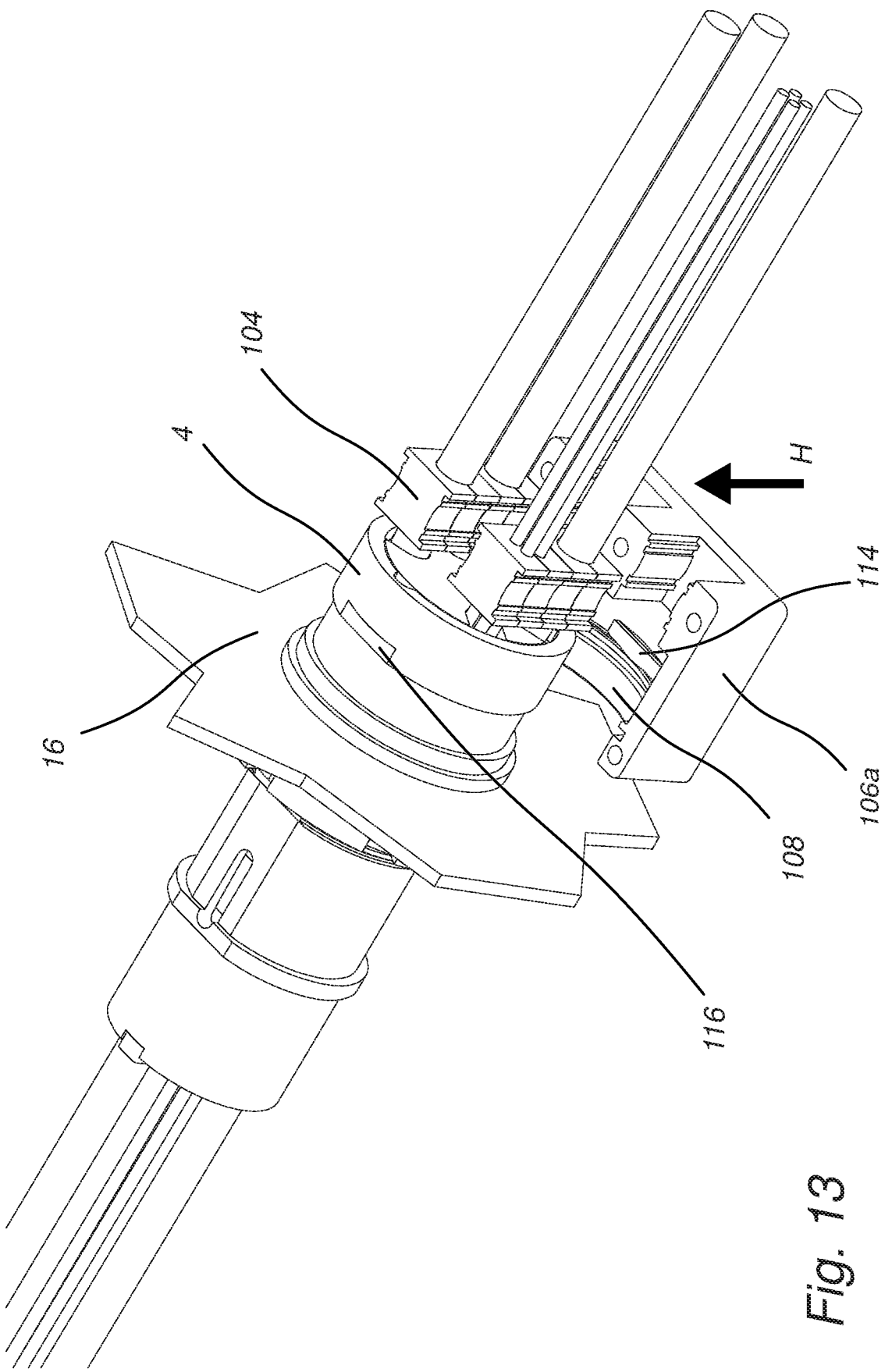

Then, with reference to FIG. 13, the lower part 106a of a frame 106 (cf. FIG. 14) is mounted, as indicated by an upward-pointing arrow H. The lower part 106a of the frame has a shape matching the resilient blocks 104 and the housing 4, in particular the cylindrical shape of the housing 4, including a cylindrical protrusion. Further, the lower part 106a comprises a lower semicircular resilient part 108 designed to seal around the housing 4. A flat section 116 (not visible but identical to the flat section 116 visible on the top of the housing 4 matches a flat protrusion 114 of the lower part 106a, preventing the lower part 106a from rotating around the housing 4.

Figure 14:
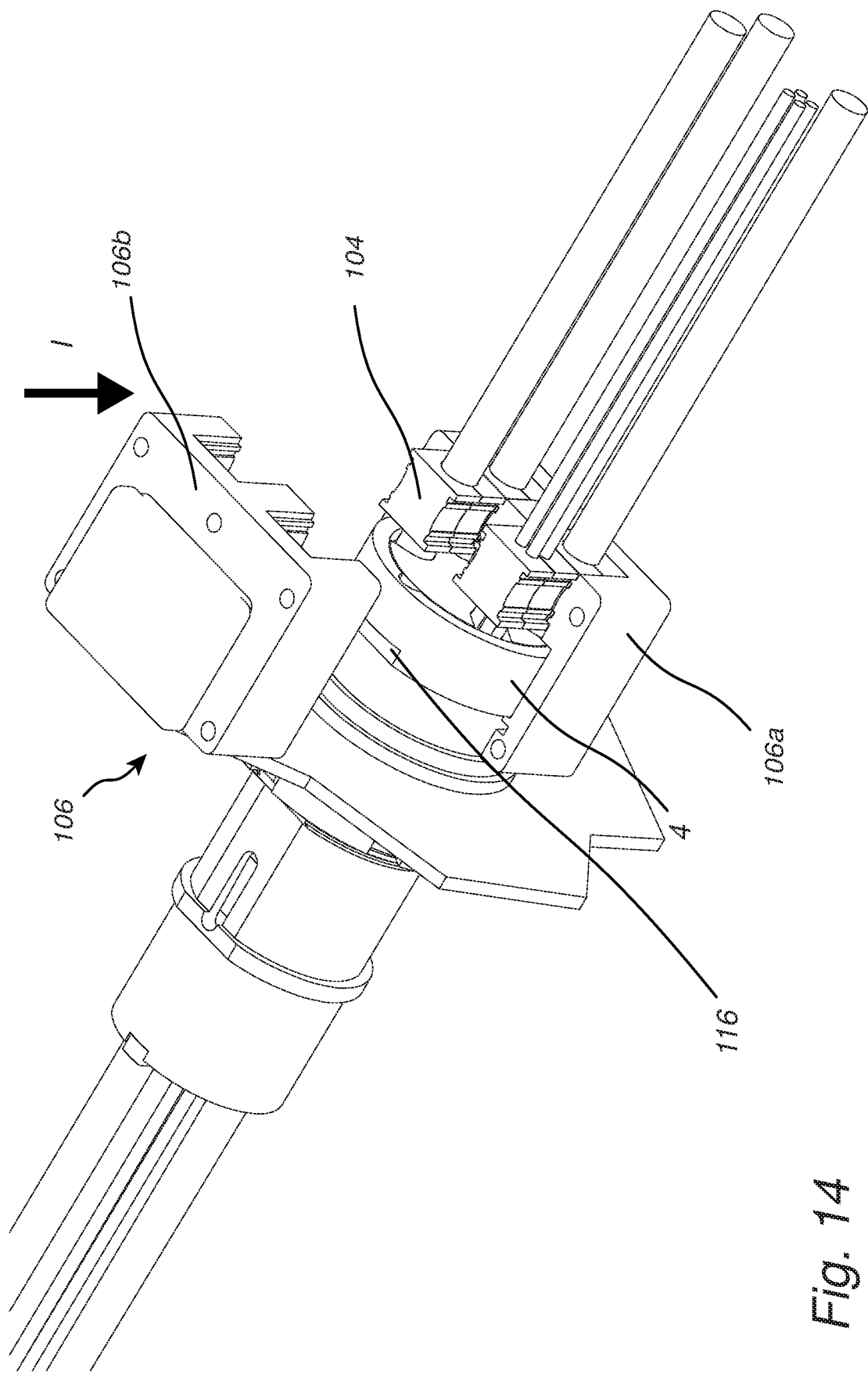

Then, with reference to FIG. 14, an upper part 106b of the frame 106 is mounted, as indicated by a downward pointing arrow I. Just like the lower part 106a, the upper part 106n of the frame 106 has a shape matching the resilient blocks 104 and the housing 4. Further, the upper part 106b comprises an upper circular-shaped resilient part (not visible) designed to seal around the housing 4. The flat section 116 on the upper part of the housing 4 matches a flat protrusion 114 on the upper part 106b of the frame (not visible, but identical to the flat section visible on the lower part 106a, cf. FIG. 13), preventing the upper part 106b from rotating around the housing 4.

The lower part 106a and the upper part 106b are made from non-resilient material, such as a thermoplastic, such as ABS. They may be identical in design, which simplifies manufacturing and installation.

Figure 15:
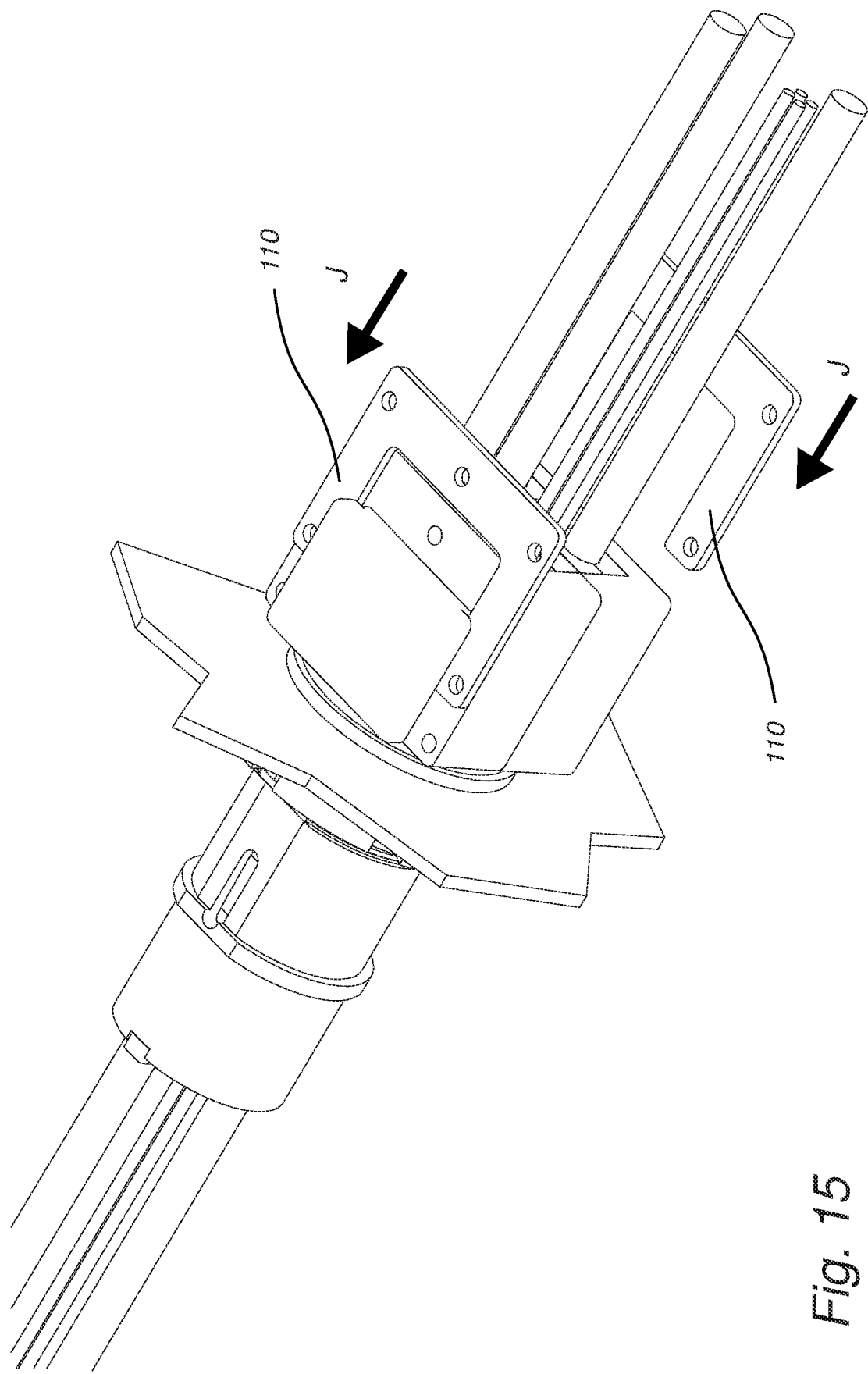

Then, with reference to FIG. 15, two respective U-shaped reinforcement plates 110 are added to the upper surface of the upper part 106b and to the lower surface of the lower part 106a, by sliding, as indicated by horizontal arrows J. The reinforcement plates 110 are preferably made of metal, such as steel.

Finally, with reference to FIG. 16, the upper part 106b and the lower part 106a are joined by bolts 112 through both of the reinforcement plates 110, holes on the reinforcement plates 110 lining up with holes in the upper part 106b and lower part 106a, compressing the resilient blocks 104, ensuring sealing action of the resilient blocks 104 around the signal leads 18 and sealing around the housing 4 by the semicircular resilient parts. Further resilient parts may seal between the upper part 106a and the lower part 106b.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The following are examples.

1. A revolver-type feed-through (2) for TEMPEST-grade electromagnetic shielding where one or more non-electric signal leads (18) pass through a wall (16) of a cabinet or other enclosure, comprising:
   a housing (4) having a conical inner surface (8), said housing being attachable to said wall through a first attachment means (10); and
   a plug member (6) having a conical outer surface (12) matching said conical inner surface (8) of said housing (4), said plug member (6) being attachable to said housing (4) through a second attachment means (14), wherein said conical inner surface (8) of said housing (4) and/or said conical outer surface (12) of said plug member have recesses (20) forming, when said plug member (6) is attached to said housing (4), a plurality of waveguides (22), said feed-through (2) being characterized by each of said first attachment means (10) and said second attachment means (14) being operable by one or more operating members (24, 26) located, with said feed-through in installed position, exclusively on one side of said wall (16), so that said first attachment means (10) and said second attachment means (14) are exclusively operable from said one side of said wall (16).

2. The feed-through (2) of example 1, wherein a said recess (20) of said conical outer surface (12) has a slot (28) for a cover (30), wherein, with said plug member (12) attached to said housing (4) and said cover (30) installed in said slot (28), said housing (4) covers said slot (28), preventing said cover (30) from being removed from said slot (28).

3. The feed-through (2) of any one of examples 1-2, wherein said housing (4) has a non-circular cross-section, which, with said housing in installed position at said wall, may fit into a corresponding non-circular opening (32) in said wall (16), preventing said housing (4) from rotating with respect to said wall.

4. The feed-through of any one of examples 1-3, wherein said one or more operating means (24) of said first attachment means (10) is operable without rotating said housing (4).

5. The feed-through (2) of any one of examples 1-4, wherein said first attachment means (10) comprises an outer thread (34) on said housing (4) and a nut (24), comprising said operating member (24), having an inner thread (36) matching said outer thread (34) if said housing (4).

6. The feed-through (2) of any one of examples 1-5, wherein said second attachment means (14) comprises:
   a bolt (38) provided with an outer thread (40);
   a threaded bore (42) in said plug member (6) with an opening (44) located, with said feed-through (2) in installed position, on said one side of said wall (16), said threaded bore (42) matching said outer thread (40) of said bolt; and
   an elongated crossbar (46);
   wherein said bolt (38), with said plug member (6) attached to said housing (4), pulls against said plug member (6) through said threaded bore (42) and pushes against said housing (4) through said crossbar (46).

7. The feed-through (2) of any one of examples 1-5, wherein said second attachment means (14) comprises:
   a transversal slot (48) through said plug member (6);
   a pair of openings (50) in said housing (4), matching said transversal slot (48); and
   a locking rod (52) provided with a convex surface (54), wherein said locking rod (52), with said plug member (6) attached to said housing (4), extends through said transversal slot (48) and said pair of openings (50) and at a first end pivoted at a pivot point (56) fixed in position with respect to said housing (4) and at a second end is pushed so that said convex surface abuts against an inner surface of said transversal slot (48), pushing said plug member (6) in a direction into said housing (6).

8. The feed-through (2) of example 7, wherein said pivot point (56) and said pushing is provided by a frame arrangement (58) mountable around said housing (4).

9. The feed-through (2) of example 8, wherein said frame arrangement (58), in installed position, abuts against a shoulder (65) of said housing (4).

10. The feed-through (2) of any one of examples 1-5, comprising the second attachment means (14) of example 6 and the second attachment means (14) of any one of examples 7-9, selectable during installation of said feed-through (2).

11. The feed-through (2) of any one of the preceding examples, wherein said plug member (6) a transversally extending pin (68), matching a transversal slot (70) in said housing (4).

12. The feed-through (2) of any one of the preceding examples, further comprising:
   a weather seal frame (106) comprising an upper part (106b) and a lower part (106a) adapted to fit around said housing; and
   a plurality of resilient sealing blocks (104) adapted to be compressed between said upper part (106b) and said lower part (106a) of said weather seal frame (106), sealing around said one or more signal leads (18).

13. The feed-through (2) of any one of the preceding examples, wherein said plurality of waveguides comprises four waveguides (22) arranged in a rectangular pattern.

14. A system, comprising the feed-through (2) of any one of the preceding examples, one or more said signal leads, and said cabinet (18) or enclosure.

15. A method of installing a revolver-type feed-through (2) for TEMPEST-grade electromagnetic shielding through a wall (16) of a cabinet or other enclosure, comprising:
   attaching a housing (4) to said wall (16) through a first attachment means (10), said housing (4) having a conical inner surface (8);
   pulling one or more non-electric signal leads (18) through said housing (4);
   attaching a plug member (6) to said housing (4), an outer conical surface (12) of said plug member (6) matching said conical inner surface (8) of said housing (4), said conical inner surface (8) and/or said conical outer surface (12) having recesses forming a plurality of waveguides (22) enclosing said one or more signal leads (18);

said method being characterized by said first attachment means (10) and said second attachment (14) means being exclusively operated from one side of said wall (16).

16. A kit, comprising:
the feed-through (2) of any one of examples 1-5 or 11-15, comprising the second attachment means of any one of examples 7-9; and
an alternative second attachment means (14),
said alternative second attachment means (14) comprising:
a bolt (38) provided with an outer thread (40);
a threaded bore (42) in said plug member (6) with an opening (44) located, with said feed-through (2) in installed position, on said one side of said wall (16), said threaded bore (42) matching said outer thread (40) of said bolt; and
an elongated crossbar (46),
wherein said bolt (38), with said plug member (6) attached to said housing (4), pulls against said plug member (6) through said threaded bore (42) and pushes against said housing (4) through said crossbar (46), and
wherein one of said second attachment means (14) and said alternative second attachment means (14) is selectable during installation of said feed-through (2).

17. A revolver-type feed-through (2) for TEMPEST-grade electromagnetic shielding where one or more non-electric signal leads (18) pass through a wall (16) of a cabinet or other enclosure, comprising:
a housing (4) having a conical inner surface (8), said housing being attachable to said wall through a first attachment means (10); and
a plug member (6) having a conical outer surface (12) matching said conical inner surface (8) of said housing (4), said plug member being attachable to said housing (4) through a second attachment means (14),
wherein said conical inner surface (8) of said housing (4) and/or said conical outer surface (12) of said plug member have recesses (20) forming, when said plug member (6) is attached to said housing (4), a plurality of waveguides (22), said feed-through (2) being characterized by further comprising:
a weather seal frame (106) comprising an upper part (106b) and a lower part (106a) adapted to fit around and seal against said housing; and
a plurality of resilient sealing blocks (104) adapted to be compressed between said upper part (106b) and said lower part (106a) of said weather seal frame (106), sealing around said one or more signal leads (18).

18. The feed-through of example 17, wherein said plurality of waveguides (22) comprises four waveguides (22) arranged in a rectangular pattern.

19. Use of a revolver-type feed-through (2) for TEMPEST-grade electromagnetic shielding where one or more non-electric signal leads (18) pass through a wall (16) of a cabinet or other enclosure, the feed-through comprising:
a housing (4) having a conical inner surface (8), said housing being attachable to said wall through a first attachment means (10); and
a plug member (6) having a conical outer surface (12) matching said conical inner surface (8) of said housing (4), said plug member being attachable to said housing (4) through a second attachment means (14),
wherein said conical inner surface (8) of said housing (4) and/or said conical outer surface (12) of said plug member (6) have recesses (20) forming, when said plug member (6) is attached to said housing (4), a plurality of waveguides (22), in combination with a weather seal comprising:
a weather seal frame (106) comprising an upper part (106b) and a lower part (106a) adapted to fit around and seal against said housing (4); and
a plurality of resilient sealing blocks (104) adapted to be compressed between said upper part (106b) and said lower part (106a) of said weather seal frame, sealing around said one or more signal leads (18).

The invention claimed is:

1. A revolver-type feed-through wherein a plurality of waveguides are distributed around an interface between a housing and a plug member pushable into the housing for electromagnetic shielding for attenuation up to the order of 100 dB at frequencies up to 10 GHz, where one or more non-electric signal leads pass through a wall of an enclosure, comprising:
said housing having a conical inner surface, said housing being attachable to said wall through a first attachment feature; and
said plug member having a conical outer surface matching said conical inner surface of said housing, said plug member being attachable to said housing through a second attachment feature,
wherein, when said plug member is attached to said housing, at least one of said conical inner surface of said housing or said conical outer surface of said plug member have recesses forming said plurality of waveguides, and
wherein each of said first attachment feature and said second attachment feature of said feed-through being operable by one or more operating members located, with said feed-through in installed position, exclusively on one side of said wall, so that said first attachment feature and said second attachment feature are exclusively operable from said one side of said wall.

2. The feed-through of claim 1, wherein a said recess of said conical outer surface has a slot for a cover, wherein, with said plug member attached to said housing and said cover installed in said slot, said housing covers said slot, preventing said cover from being removed from said slot.

3. The feed-through of claim 1, wherein said housing has a non-circular cross-section, which, with said housing in installed position at said wall, is configured to fit into a corresponding non-circular opening in said wall, preventing said housing from rotating with respect to said wall.

4. The feed-through of claim 1, wherein said one or more operating members of said first attachment feature is operable without rotating said housing.

5. The feed-through of claim 1, wherein said first attachment feature comprises an outer thread on said housing and a nut, acting as said operating member, having an inner thread matching said outer thread of said housing.

6. The feed-through of claim 1, wherein said plug member comprises a transversally extending pin, matching a transversal slot in said housing.

7. The feed-through of claim 1, further comprising:
a weather seal frame comprising an upper part and a lower part adapted to fit around said housing; and a plurality of resilient sealing blocks adapted to be compressed between said upper part and said lower part of said weather seal frame, sealing around said one or more signal leads.

8. The feed-through of claim 1, wherein said plurality of waveguides comprises four waveguides arranged in a rectangular pattern.

9. A system, comprising the feed-through of claim 1, one or more said signal leads, and said enclosure.

10. The feed-through of claim 1, wherein said second attachment feature comprises:
- a transversal slot through said plug member;
- a pair of openings in said housing, matching said transversal slot; and
- a locking rod provided with a convex surface,
- wherein said locking rod, with said plug member attached to said housing, extends through said transversal slot and said pair of openings and at a first end pivoted at a pivot point fixed in position with respect to said housing and at a second end is pushable so that said convex surface abuts against an inner surface of said transversal slot, pushing said plug member in a direction into said housing.

11. The feed-through of claim 10, wherein said pivot point and said pushing is provided by a frame arrangement mountable around said housing.

12. The feed-through of claim 11, wherein said frame arrangement, in installed position, abuts against a shoulder of said housing.

13. The feed-through of claim 1, wherein said second attachment feature comprises:
- a bolt provided with an outer thread;
- a threaded bore in said plug member with an opening located, with said feed-through in installed position, on said one side of said wall, said threaded bore matching said outer thread of said bolt; and
- an elongated crossbar; wherein said bolt, with said plug member attached to said housing, pulls against said plug member through said threaded bore and pushes against said housing through said crossbar.

14. The feed-through of claim 1, provided as a kit and comprising two (i, ii) second attachment features,
- wherein one (i) of the two second attachment features comprises:
  - a transversal slot through said plug member;
  - a pair of openings in said housing, matching said transversal slot; and
  - a locking rod provided with a convex surface, wherein said locking rod, with said plug member attached to said housing, extends through said transversal slot and said pair of openings and at a first end pivoted at a pivot point fixed in position with respect to said housing and at a second end is pushable so that said convex surface abuts against an inner surface of said transversal slot, pushing said plug member in a direction into said housing, and
- wherein another (ii) of the two second attachment features comprises:
  - a bolt provided with an outer thread;
  - a threaded bore in said plug member with an opening located, with said feed-through in installed position, on said one side of said wall, said threaded bore matching said outer thread of said bolt; and
  - an elongated crossbar;
  - wherein said bolt, with said plug member attached to said housing, pulls against said plug member through said threaded bore and pushes against said housing through said crossbar, and
- wherein the two (i, ii) second attachment features are selectable during installation of said feed-through.

15. A method of installing a revolver-type feed-through wherein a plurality of waveguides are distributed around an interface between a housing and a plug member pushable into the housing for electromagnetic shielding for attenuation up to the order of 100 dB at frequencies up to 10 GHz, through a wall of an enclosure, comprising:
- attaching said housing to said wall through a first attachment feature, said housing having a conical inner surface;
- pulling one or more non-electric signal leads through said housing;
- attaching said plug member to said housing through a second attachment feature, an outer conical surface of said plug member matching said conical inner surface of said housing, wherein at least one of said conical inner surface or said conical outer surface have recesses forming said plurality of waveguides enclosing said one or more signal leads;
- wherein said first attachment feature and said second attachment feature of said feed-through are configured to be exclusively operated from one side of said wall.

* * * * *